(12) United States Patent
Domino et al.

(10) Patent No.: US 10,554,197 B2
(45) Date of Patent: Feb. 4, 2020

(54) FLEXIBLE L-NETWORK ANTENNA TUNER CIRCUIT

(71) Applicant: Skyworks Solutions, Inc., Woburn, MA (US)

(72) Inventors: William J. Domino, Yorba Linda, CA (US); Stephane Richard Marie Wloczysiak, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 51 days.

(21) Appl. No.: 15/453,785

(22) Filed: Mar. 8, 2017

(65) Prior Publication Data

US 2017/0279436 A1   Sep. 28, 2017

Related U.S. Application Data

(62) Division of application No. 14/314,550, filed on Jun. 25, 2014, now Pat. No. 9,621,129.

(60) Provisional application No. 61/841,217, filed on Jun. 28, 2013.

(51) Int. Cl.
*H03H 11/28* (2006.01)

(52) U.S. Cl.
CPC .................................. *H03H 11/28* (2013.01)

(58) Field of Classification Search
CPC ..................................................... H03H 11/28
USPC ......................................................... 333/17.3
See application file for complete search history.

(56) References Cited

U.S. PATENT DOCUMENTS

| | | | |
|---|---|---|---|
| 5,883,541 A | 3/1999 | Tahara et al. | |
| 6,600,294 B1 | 7/2003 | DiPiazza | |
| 7,106,121 B2 | 9/2006 | Hidaka et al. | |
| 7,307,490 B2 | 12/2007 | Kizuki et al. | |
| 2003/0092388 A1 | 5/2003 | Aggarwal et al. | |
| 2003/0100333 A1 | 5/2003 | Standke et al. | |
| 2003/0137284 A1 | 7/2003 | DiPiazza | |
| 2004/0239442 A1 | 12/2004 | Wilcox | |
| 2009/0174496 A1* | 7/2009 | Van Bezooijen | H03F 1/56 333/17.3 |
| 2013/0069737 A1 | 3/2013 | See et al. | |

(Continued)

FOREIGN PATENT DOCUMENTS

| CN | 1795617 A | 6/2006 |
|---|---|---|
| CN | 102332931 | 1/2012 |

(Continued)

OTHER PUBLICATIONS

Search Report and Written Opinion, re PCT Application No. PCT/US2014/044372 dated Oct. 27, 2014.

*Primary Examiner* — Stephen E. Jones
*Assistant Examiner* — Samuel S Outten
(74) *Attorney, Agent, or Firm* — Knobbe, Martens, Olson & Bear, LLP

(57) ABSTRACT

An 'L' shaped dynamically configurable impedance matching circuit is presented herein. The circuit can include a series element and a shunt element. The shunt element in the L-shaped impedance matching circuit can be moved or modified based on the impedance of the circuit elements in electrical communication with each side of the impedance matching circuit. Thus, in some cases, the impedance matching circuit may be a flexible circuit that can be dynamically modified based on the environment or configuration of the wireless device that includes the impedance matching circuit.

20 Claims, 22 Drawing Sheets

(56) References Cited

U.S. PATENT DOCUMENTS

2014/0175896 A1 6/2014 Suzuki
2015/0003306 A1 1/2015 Domino et al.
2017/0279437 A1 9/2017 Domino et al.

FOREIGN PATENT DOCUMENTS

CN 102428648 A 4/2012
WO WO 2012/169015 A1 12/2012

* cited by examiner

FLEXIBLE L-NETWORK ANTENNA TUNER CIRCUIT

RELATED APPLICATIONS

This disclosure is a divisional of U.S. application Ser. No. 14/314,550, filed Jun. 25, 2014 and titled "FLEXIBLE L-NETWORK ANTENNA TUNER CIRCUIT," which is hereby expressly incorporated by reference herein in its entirety, and which claims priority to U.S. Provisional Application No. 61/841,217 filed Jun. 28, 2013 and entitled "FLEXIBLE L-NETWORK ANTENNA TUNER CIRCUIT," the disclosure of which is expressly incorporated by reference herein in its entirety.

TECHNICAL FIELD

The present disclosure relates generally to impedance matching elements. More specifically, the present disclosure relates to flexible and tunable impedance matching elements.

BACKGROUND

Radio Frequency (RF) switches, such as transistor switches, can be used to switch signals between one or more poles and one or more throws. Transistor switches, or portions thereof, can be controlled through transistor biasing and/or coupling. Design and use of bias and/or coupling circuits in connection with RF switches can affect switching performance.

In some cases, circuit elements may generate different impedance values. To improve performance of a circuit, it is often desirable to select circuit elements with matching impedance values.

SUMMARY

In accordance with some embodiments, the present disclosure relates to an impedance matching circuit that includes a series element located between a first node and a second node. In some cases, the first node may be in electrical communication with an antenna and the second node may be in electrical communication with a diplexer. In other cases, the first node and/or second node may be in electrical communication with a low noise amplifier, filter, power amplifier, etc. The impedance matching circuit may further include a shunt element configured to be in electrical communication between one of the first node and the second node, and ground. In addition, the impedance matching circuit can include a switch configured to switch the shunt element from being in electrical communication between the first node and ground to being in electrical communication between the second node and ground. Further, the switch may be configured to switch the shunt element from being in electrical communication between the second node and ground to being in electrical communication between the first node and ground.

In some cases, the series element includes a capacitor or a capacitor and an inductor. The capacitor may be a digital switch capacitor that may include one or more capacitors. In some implementations, the capacitor is an analog tunable capacitor.

The shunt elements may include an inductor and a capacitor. The capacitor may be a digital switch capacitor including one or more capacitors or an analog tunable capacitor. Further, the inductor and the capacitor may be configured in parallel.

In some implementations, the switch includes a field-effect transistor. Further, the switch may be configured to place the impedance matching circuit in a bypass mode. In some cases, the bypass mode enables a signal to be transmitted from the first node to the second node without the shunt element in electrical communication with the first node and the second node. In other cases, the bypass mode enables a signal to be transmitted from the first node to the second node with the shunt element in electrical communication with the first node and the second node.

In certain embodiments of the present disclosure, a wireless device is presented. The wireless device may include a first element, a second element, and an impedance matching circuit. The first element and the second element may be associated with different impedance values for at least a period of time. Further, the impedance matching circuit may be electrically connected between the first element and the second element, and in electrical communication with the first element and the second element.

In some embodiments, a wireless device is presented that includes an antenna associated with a first impedance value. Further, the wireless device may include a diplexer associated with a second impedance value. The second impedance value may differ from the first impedance value for at least a period of time. In addition, the wireless device can include an impedance matching circuit electrically connected between the antenna and the diplexer, and in electrical communication with the antenna and the diplexer.

With some implementations, the impedance matching circuit includes a series element located between a first node and a second node. Further, the impedance matching circuit may include a shunt element configured to be in electrical communication between one of the first node and the second node, and a ground. In addition, the impedance matching circuit can include a switch configured to switch the shunt element from being in electrical communication between the first node and the ground to being in electrical communication between the second node and the ground.

In some cases, the wireless device includes a controller configured to operate one or more switches of the impedance matching circuit. In addition, the wireless device may include one or more sensors. In some such cases, the controller is configured to operate the one or more switches based at least partially on information obtained from the one or more sensors.

In some designs, the antenna is a diversity antenna configured to receive a signal. Generally, the diversity antenna is not configured to transmit signals. Alternatively, in certain embodiments, the antenna is a main antenna configured to both transmit and receive signals.

In certain embodiments, a method for matching the impedance of a pair of circuit elements is disclosed. The method may be performed by a controller for an impedance matching circuit. The method can include determining a first impedance value for a first circuit element in electrical communication with an impedance matching circuit. Further, the method can include determining a second impedance value for a second circuit element in electrical communication with the impedance matching circuit. In addition, the method may include comparing the first impedance value to the second impedance value to determine whether the first impedance value is greater than the second impedance value. Moreover, responsive to determining that the first impedance value is greater than the second impedance value, the method may include configuring a shunt element to be in direct electrical communication with the first circuit element and not the second circuit element. In some cases, responsive to determining that the first impedance value matches the second impedance value to a threshold degree, the method may further include configuring the impedance matching circuit to be in a bypass mode.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

DETAILED DESCRIPTION

Figure 1:
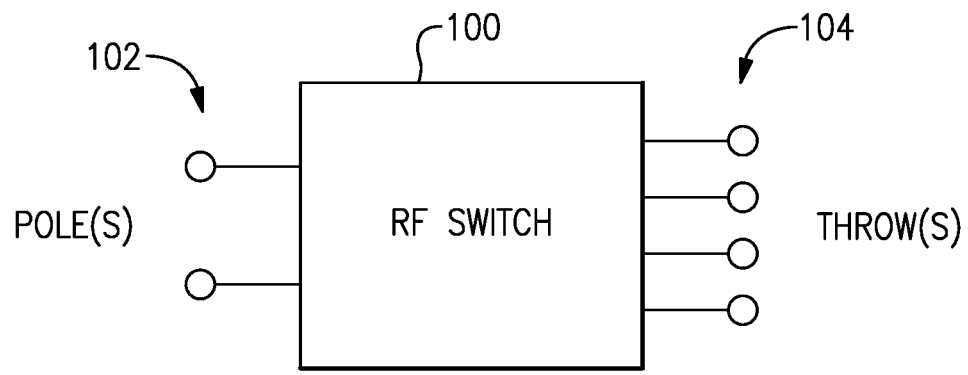
FIG. 1 schematically shows a radio-frequency (RF) switch configured to switch one or more signals between one or more poles and one or more throws.

The headings provided herein, if any, are for convenience only and do not necessarily affect the scope or meaning of the claimed invention.

Introduction

To improve power transfer between circuit elements, it is typically desirable to select elements with matching impedance. However, in some cases, circuit elements may be designed with different impedance values. Further, in some cases, environmental factors, such as the positioning of a device may affect the impedance for the circuit elements. Having elements with mismatched impedance an reduce the power transfer between the circuit elements. For example, a mismatch between the impedance of an antenna and an amplifier circuit or a transceiver may result in reduced power transfer between the antenna and the amplifier circuit or the transceiver. One solution to the problem of mismatched impedance is to use an impedance matching circuit between circuit elements that can be used to match the impedance of the two circuit elements.

Often an impedance matching circuit will include a shunt element on either side of a series element. However, in many cases, a shunt element can be omitted from one side of the impedance matching circuit based on the impedance value. Typically, the shunt element is omitted from the lower impedance side and included on the higher impedance side of the impedance matching circuit. The shunt elements can include a number of circuit elements, such as capacitors, inductors, resistors, etc. Advantageously, in certain embodiments, omitting the shunt element from one side of the impedance matching circuit reduces both the size and the cost of the impedance matching circuit.

However, in certain cases, it can be challenging and sometimes infeasible to determine a priori which shunt element to omit from the impedance matching circuit. One reason it is difficult to determine a priori the shunt element to omit is that the impedance for one or more of the circuit elements to be matched by the impedance matching circuit may fluctuate. For example, if the impedance matching circuit is electrically positioned between an antenna and another device element, the impedance of the antenna may fluctuate based on a number of factors, such as position of the antenna, position of a user's hand in relation to the antenna, location of the wireless device with respect to blocking elements in the environment, etc. Further, in some cases, the impedance of the other device element may also fluctuate. For example, if the other device element is a power amplifier module, its impedance may vary based on a gain setting for the power amplifier module.

Certain embodiments disclosed herein enable the use of an impedance matching circuit that is shaped similarly to an 'L' instead of a 'π' shape. The impedance matching circuit can include a series element and a shunt element. The shunt element in the L-shaped impedance matching circuit can be moved or modified based on the impedance of the circuit elements in electrical communication with each side of the impedance matching circuit. In other words, in certain embodiments, the impedance matching circuit may be a flexible circuit that can be dynamically modified based on the environment or configuration of the wireless device that includes the impedance matching circuit. Although in some embodiments the shunt element may be physically moved, typically moving the shunt element refers to adjusting the electrical connections of the shunt element to cause a reconfiguration of the impedance matching circuit.

Moving or modifying the shunt element of the impedance matching circuit may include modifying which device element is in electrical communication with the shunt element. In some cases, switches may be used to change which device element is in electrical communication with the shunt element. Further, in some cases, the switches may modify the portion of the impedance matching circuit that is in electrical communication with the shunt element. In addition, or alternatively, modifying the impedance matching circuit may include modifying the device elements included in the configuration of the shunt element. For example, the shunt element may be modified to include a single device element, or a pair of device elements in parallel. Moreover, in certain embodiments, modifying the impedance matching circuit is not limited to modifying the shunt element. In other words, the series element that is in electrical communication between the two device elements may be modified. Additional details for modifying the impedance matching circuit are described herein.

Example Components of a Switching Device

FIG. 1 schematically shows a radio-frequency (RF) switch 100 configured to switch one or more signals between one or more poles 102 and one or more throws 104. In some embodiments, such a switch can be based on one or more field-effect transistors (FETs) such as silicon-on-insulator (SOI) FETs. When a particular pole is connected to a particular throw, such a path is commonly referred to as being closed or in an ON state. When a given path between a pole and a throw is not connected, such a path is commonly referred to as being open or in an OFF state.

Figure 2:
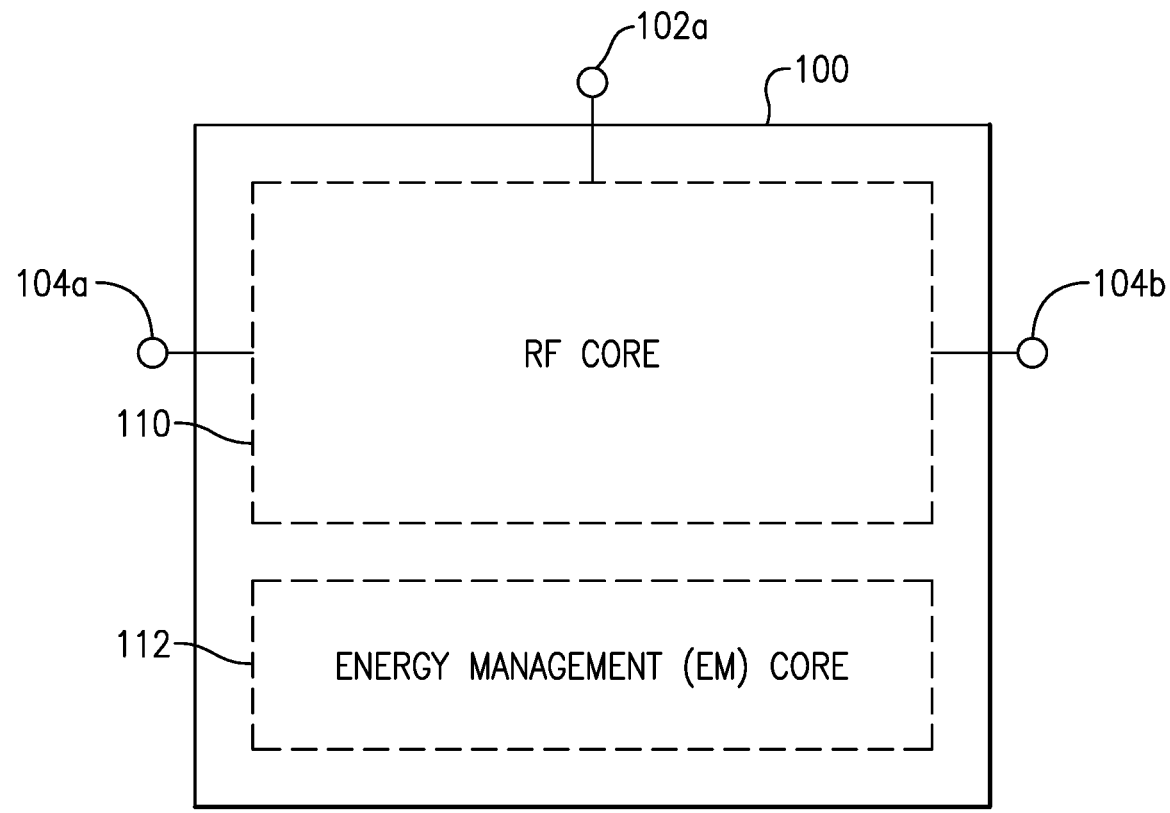
FIG. 2 shows that in some implementations, the RF switch of FIG. 1 can include an RF core and an energy management (EM) core.

FIG. 2 shows that in some implementations, the RF switch 100 of FIG. 1 can include an RF core 110 and an energy management (EM) core 112. The RF core 110 can be configured to route RF signals between the first and second ports. In the example single-pole-double-throw (SPDT) configuration shown in FIG. 2, such first and second ports can include a pole 102a and a first throw 104a, or the pole 102a and a second throw 104b.

In some embodiments, EM core 112 can be configured to supply, for example, voltage control signals to the RF core. The EM core 112 can be further configured to provide the RF switch 100 with logic decoding and/or power supply conditioning capabilities.

In some embodiments, the RF core 110 can include one or more poles and one or more throws to enable passage of RF signals between one or more inputs and one or more outputs of the switch 100. For example, the RF core 110 can include a single-pole double-throw (SPDT or SP2T) configuration as shown in FIG. 2.

Figure 3:
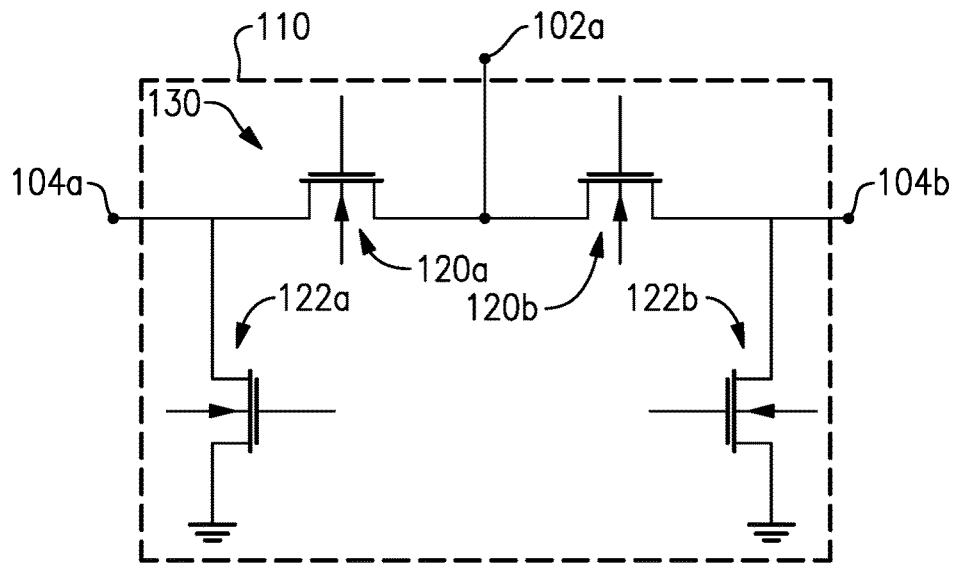
FIG. 3 shows an example of the RF core implemented in a single-pole-double-throw (SPDT) configuration.

In the example SPDT context, FIG. 3 shows a more detailed example configuration of an RF core 110. The RF core 110 is shown to include a single pole 102a coupled to first and second throw nodes 104a, 104b via first and second transistors (e.g., FETs) 120a, 120b. The first throw node 104a is shown to be coupled to an RF ground via an FET 122a to provide shunting capability for the node 104a. Similarly, the second throw node 104b is shown to be coupled to the RF ground via an FET 122b to provide shunting capability for the node 104b.

In an example operation, when the RF core 110 is in a state where an RF signal is being passed between the pole 102a and the first throw 104a, the FET 120a between the pole 102a and the first throw node 104a can be in an ON state, and the FET 120b between the pole 102a and the second throw node 104b can be in an OFF state. For the shunt FETs 122a, 122b, the shunt FET 122a can be in an OFF state so that the RF signal is not shunted to ground as it travels from the pole 102a to the first throw node 104a. The shunt FET 122b associated with the second throw node 104b can be in an ON state so that any RF signals or noise arriving at the RF core 110 through the second throw node 104b is shunted to the ground so as to reduce undesirable interference effects to the pole-to-first-throw operation.

Although the foregoing example is described in the context of a single-pole-double-throw configuration, it will be understood that the RF core can be configured with other numbers of poles and throws. For example, there may be more than one pole, and the number of throws can be less than or greater than the example number of two.

In the example of FIG. 3, the transistors between the pole 102a and the two throw nodes 104a, 104b are depicted as single transistors. In some implementations, such switching functionalities between the pole(s) and the throw(s) can be provided by switch arm segments, where each switch arm segment includes a plurality of transistors such as FETs.

Figure 4:
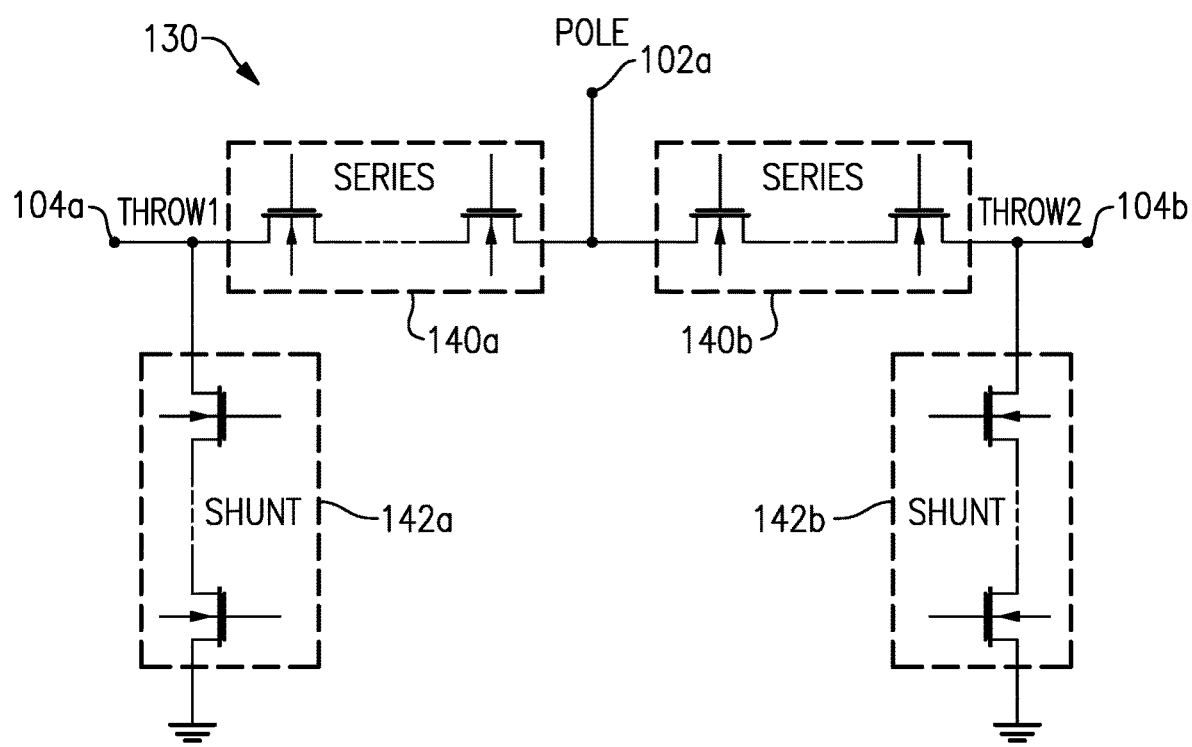
FIG. 4 shows an example of the RF core implemented in an SPDT configuration where each switch arm can include a plurality of field-effect transistors (FETS) connected in series.

An example RF core configuration 130 of an RF core having such switch arm segments is shown in FIG. 4. In the example, the pole 102a and the first throw node 104a are shown to be coupled via a first switch arm segment 140a. Similarly, the pole 102a and the second throw node 104b are shown to be coupled via a second switch arm segment 140b. The first throw node 104a is shown to be capable of being shunted to an RF ground via a first shunt arm segment 142a. Similarly, the second throw node 104b is shown to be capable of being shunted to the RF ground via a second shunt arm segment 142b.

In an example operation, when the RF core 130 is in a state where an RF signal is being passed between the pole 102a and the first throw node 104a, all of the FETs in the first switch arm segment 140a can be in an ON state, and all of the FETs in the second switch arm segment 140b can be in an OFF state. The first shunt arm 142a for the first throw node 104a can have all of its FETs in an OFF state so that the RF signal is not shunted to ground as it travels from the pole 102a to the first throw node 104a. All of the FETs in the second shunt arm 142b associated with the second throw node 104b can be in an ON state so that any RF signals or noise arriving at the RF core 130 through the second throw node 104b is shunted to the ground so as to reduce undesirable interference effects to the pole-to-first-throw operation.

Again, although described in the context of an SP2T configuration, it will be understood that RF cores having other numbers of poles and throws can also be implemented.

In some implementations, a switch arm segment (e.g., 140a, 140b, 142a, 142b) can include one or more semiconductor transistors such as FETs. In some embodiments, an FET may be capable of being in a first state or a second state and can include a gate, a drain, a source, and a body (sometimes also referred to as a substrate). In some embodiments, an FET can include a metal-oxide-semiconductor field effect transistor (MOSFET). In some embodiments, one or more FETs can be connected in series forming a first end and a second end such that an RF signal can be routed between the first end and the second end when the FETs are in a first state (e.g., ON state).

Figure 5:
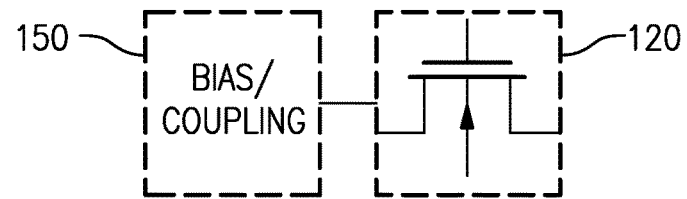
FIG. 5 schematically shows that controlling of one or more FETs in an RF switch can be facilitated by a circuit configured to bias and/or couple one or more portions of the FETs.

At least some of the present disclosure relates to how an FET or a group of FETs can be controlled to provide switching functionalities in desirable manners. FIG. 5 schematically shows that in some implementations, such controlling of an FET 120 can be facilitated by a circuit 150 configured to bias and/or couple one or more portions of the FET 120. In some embodiments, such a circuit 150 can include one or more circuits configured to bias and/or couple a gate of the FET 120, bias and/or couple a body of the FET 120, and/or couple a source/drain of the FET 120.

Figure 6:
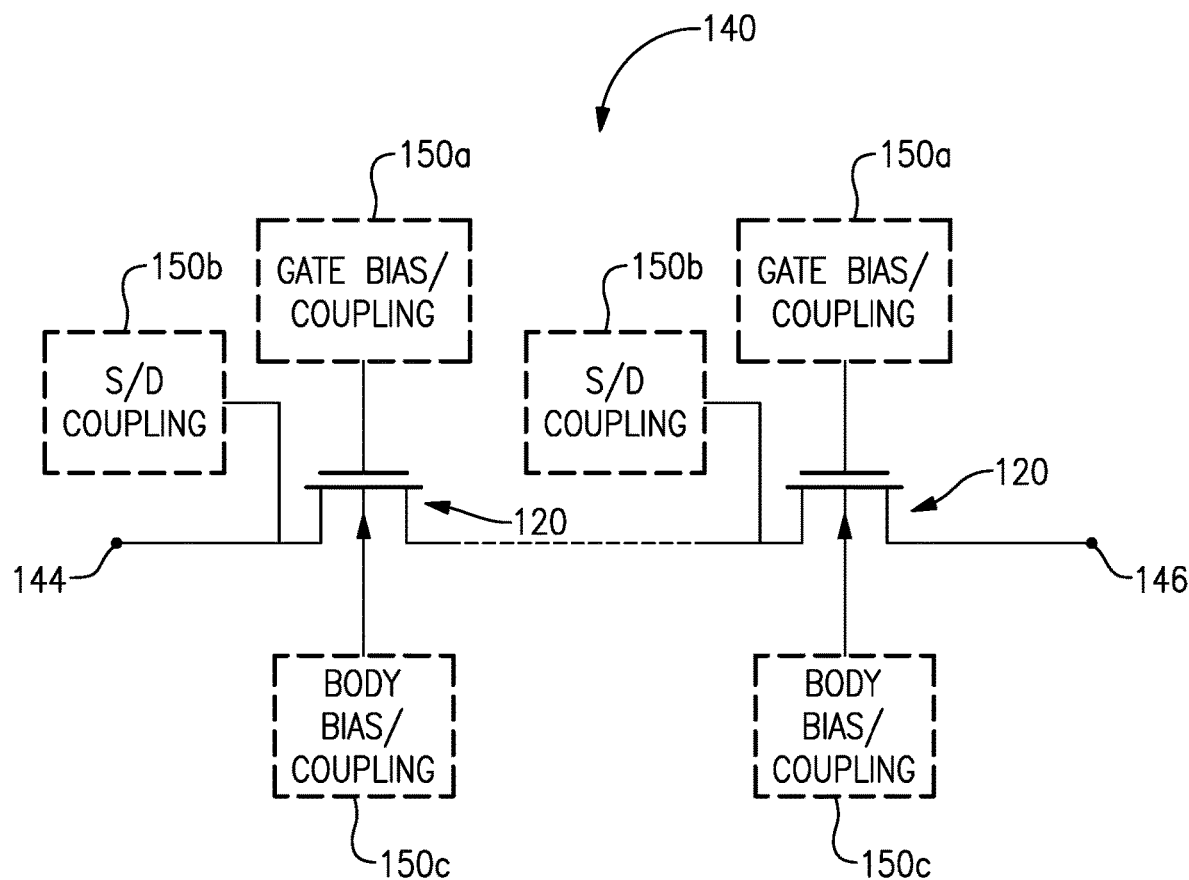
FIG. 6 shows examples of the bias/coupling circuit implemented on different parts of a plurality of FETs in a switch arm.

Schematic examples of how such biasing and/or coupling of different parts of one or more FETs are described in reference to FIG. 6. In FIG. 6, a switch arm segment 140 (that can be, for example, one of the example switch arm segments 140a, 140b, 142a, 142b of the example of FIG. 4) between nodes 144, 146 is shown to include a plurality of FETs 120. Operations of such FETs can be controlled and/or facilitated by a gate bias/coupling circuit 150a, and a body bias/coupling circuit 150c, and/or a source/drain coupling circuit 150b.

Gate Bias/Coupling Circuit

In the example shown in FIG. 6, the gate of each of the FETs 120 can be connected to the gate bias/coupling circuit 150a to receive a gate bias signal and/or couple the gate to another part of the FET 120 or the switch arm 140. In some implementations, designs or features of the gate bias/coupling circuit 150a can improve performance of the switch arm 140. Such improvements in performance can include, but are not limited to, device insertion loss, isolation performance, power handling capability and/or switching device linearity.

Body Bias/Coupling Circuit

As shown in FIG. 6, the body of each FET 120 can be connected to the body bias/coupling circuit 150c to receive a body bias signal and/or couple the body to another part of the FET 120 or the switch arm 140. In some implementations, designs or features of the body bias/coupling circuit 150c can improve performance of the switch arm 140. Such improvements in performance can include, but are not limited to, device insertion loss, isolation performance, power handling capability and/or switching device linearity.

Source/Drain Coupling Circuit

As shown in FIG. 6, the source/drain of each FET 120 can be connected to the coupling circuit 150b to couple the source/drain to another part of the FET 120 or the switch arm 140. In some implementations, designs or features of the coupling circuit 150b can improve performance of the switch arm 140. Such improvements in performance can include, but are not limited to, device insertion loss, isolation performance, power handling capability and/or switching device linearity.

Examples of Switching Performance Parameters

Insertion Loss

A switching device performance parameter can include a measure of insertion loss. A switching device insertion loss can be a measure of the attenuation of an RF signal that is routed through the RF switching device. For example, the magnitude of an RF signal at an output port of a switching device can be less than the magnitude of the RF signal at an input port of the switching device. In some embodiments, a switching device can include device components that introduce parasitic capacitance, inductance, resistance, or conductance into the device, contributing to increased switching device insertion loss. In some embodiments, a switching device insertion loss can be measured as a ratio of the power or voltage of an RF signal at an input port to the power or voltage of the RF signal at an output port of the switching device. Decreased switching device insertion loss can be desirable to enable improved RF signal transmission.

Isolation

A switching device performance parameter can also include a measure of isolation. Switching device isolation can be a measure of the RF isolation between an input port and an output port an RF switching device. In some embodiments, it can be a measure of the RF isolation of a switching device while the switching device is in a state where an input port and an output port are electrically isolated, for example while the switching device is in an OFF state. Increased switching device isolation can improve RF signal integrity. In certain embodiments, an increase in isolation can improve wireless communication device performance.

Intermodulation Distortion

A switching device performance parameter can further include a measure of intermodulation distortion (IMD) performance. Intermodulation distortion (IMD) can be a measure of non-linearity in an RF switching device.

IMD can result from two or more signals mixing together and yielding frequencies that are not harmonic frequencies. For example, suppose that two signals have fundamental frequencies $f_1$ and $f_2$ ($f_2 > f_1$) that are relatively close to each other in frequency space. Mixing of such signals can result in peaks in frequency spectrum at frequencies corresponding to different products of fundamental and harmonic frequencies of the two signals. For example, a second-order intermodulation distortion (also referred to as IMD2) is typically considered to include frequencies $f_1+f_2$, $f_2-f_1$, $2f_1$, and $2f_2$. A third-order IMD (also referred to as IMD3) is typically considered to include $2f_1+f_2$, $2f_1-f_2$, $f_1+2f_2$, $f_1-2f_2$. Higher order products can be formed in similar manners.

In general, as the IMD order number increases, power levels decrease. Accordingly, second and third orders can be undesirable effects that are of particular interest. Higher orders such as fourth and fifth orders can also be of interest in some situations.

In some RF applications, it can be desirable to reduce susceptibility to interference within an RF system. Non linearity in RF systems can result in introduction of spurious signals into the system. Spurious signals in the RF system can result in interference within the system and degrade the information transmitted by RF signals. An RF system having increased non-linearity can demonstrate increased susceptibility to interference. Non-linearity in system components, for example switching devices, can contribute to the introduction of spurious signals into the RF system, thereby contributing to degradation of overall RF system linearity and IMD performance.

In some embodiments, RF switching devices can be implemented as part of an RF system including a wireless communication system. IMD performance of the system can be improved by increasing linearity of system components, such as linearity of an RF switching device. In some embodiments, a wireless communication system can operate in a multi-band and/or multi-mode environment. Improvement in intermodulation distortion (IMD) performance can be desirable in wireless communication systems operating in a multi-band and/or multi-mode environment. In some embodiments, improvement of a switching device IMD performance can improve the IMD performance of a wireless communication system operating in a multi-mode and/or multi-band environment.

Improved switching device IMD performance can be desirable for wireless communication devices operating in various wireless communication standards, for example for wireless communication devices operating in the Long Term Evolution (LTE) communication standard. In some RF applications, it can be desirable to improve linearity of switching devices operating in wireless communication devices that enable simultaneous transmission of data and voice communication. For example, improved IMD performance in switching devices can be desirable for wireless communication devices operating in the LTE communication standard and performing simultaneous transmission of voice and data communication (e.g., Simultaneous Voice and LTE (SVLTE)).

High Power Handling Capability

In some RF applications, it can be desirable for RF switching devices to operate under high power while reducing degradation of other device performance parameters. In some embodiments, it can be desirable for RF switching devices to operate under high power with improved intermodulation distortion, insertion loss, and/or isolation performance.

In some embodiments, an increased number of transistors can be implemented in a switch arm segment of a switching device to enable improved power handling capability of the switching device. For example, a switch arm segment can include an increased number of FETs connected in series, an increased FET stack height, to enable improved device performance under high power. However, in some embodiments, increased FET stack height can degrade the switching device insertion loss performance.

Examples of FET Structures and Fabrication Process Technologies

A switching device can be implemented on-die, off-die, or some combination thereon. A switching device can also be fabricated using various technologies. In some embodiments, RF switching devices can be fabricated with silicon or silicon-on-insulator (SOI) technology.

As described herein, an RF switching device can be implemented using silicon-on-insulator (SOI) technology. In some embodiments, SOI technology can include a semiconductor substrate having an embedded layer of electrically insulating material, such as a buried oxide layer beneath a silicon device layer. For example, an SOI substrate can include an oxide layer embedded below a silicon layer. Other insulating materials known in the art can also be used.

Implementation of RF applications, such as an RF switching device, using SOI technology can improve switching device performance. In some embodiments, SOI technology can enable reduced power consumption. Reduced power consumption can be desirable in RF applications, including those associated with wireless communication devices. SOI technology can enable reduced power consumption of device circuitry due to decreased parasitic capacitance of transistors and interconnect metallization to a silicon substrate. Presence of a buried oxide layer can also reduce junction capacitance or use of high resistivity substrate, enabling reduced substrate related RF losses. Electrically isolated SOI transistors can facilitate stacking, contributing to decreased chip size.

Figure 7A:
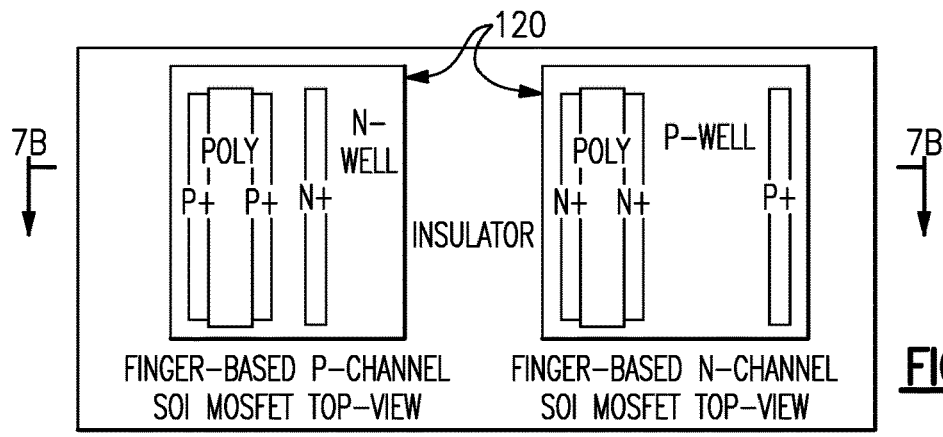
FIGS. 7A and 7B show plan and side sectional views of an example finger-based FET device implemented in a silicon-on-insulator (SOI) configuration.
Figure 7B:
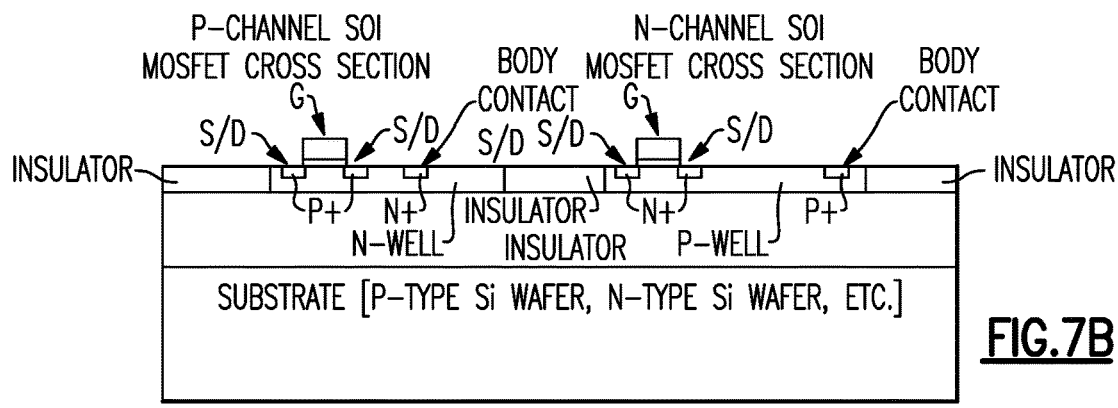

In some SOI FET configurations, each transistor can be configured as a finger-based device where the source and drain are rectangular shaped (in a plan view) and a gate structure extends between the source and drain like a rectangular shaped finger. FIGS. 7A and 7B show plan and side sectional views of an example finger-based FET device implemented on SOI. As shown, FET devices described herein can include a p-type FET or an n-type FET. Thus, although some FET devices are described herein as p-type devices, it will be understood that various concepts associated with such p-type devices can also apply to n-type devices.

As shown in FIGS. 7A and 7B, a pMOSFET can include an insulator layer formed on a semiconductor substrate. The insulator layer can be formed from materials such as silicon dioxide or sapphire. An n-well is shown to be formed in the insulator such that the exposed surface generally defines a rectangular region. Source (S) and drain (D) are shown to be p-doped regions whose exposed surfaces generally define rectangles. As shown, S/D regions can be configured so that source and drain functionalities are reversed.

FIGS. 7A and 7B further show that a gate (G) can be formed on the n-well so as to be positioned between the source and the drain. The example gate is depicted as having a rectangular shape that extends along with the source and the drain. Also shown is an n-type body contact. Formations of the rectangular shaped well, source and drain regions, and the body contact can be achieved by a number of known techniques.

Figure 8A:
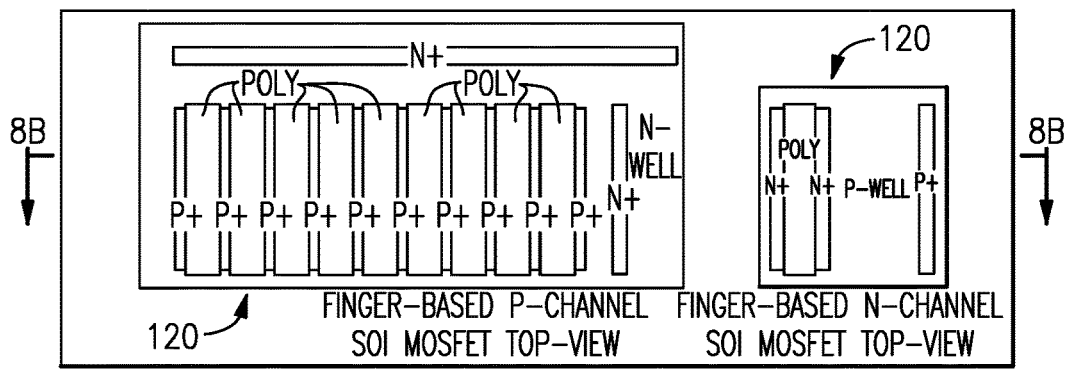
FIGS. 8A and 8B show plan and side sectional views of an example of a multiple-finger FET device implemented in an SOI configuration.
Figure 8B:
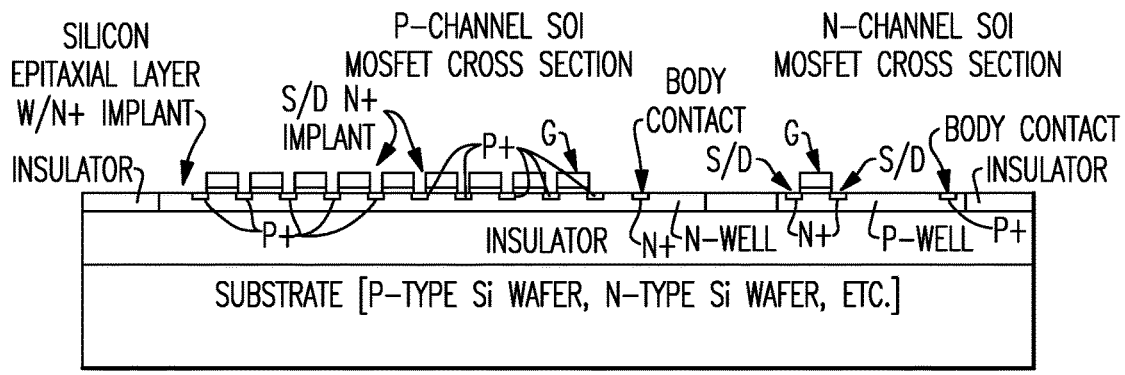

FIGS. 8A and 8B show plan and side sectional views of an example of a multiple-finger FET device implemented on SOI. Formations of rectangular shaped n-well, rectangular shaped p-doped regions, rectangular shaped gates, and n-type body contact can be achieved in manners similar to those described in reference to FIGS. 7A and 7B.

The example multiple-finger FET device of FIGS. 8A and 8B can be made to operate such that a drain of one FET acts as a source of its neighboring FET. Thus, the multiple-finger FET device as a whole can provide a voltage-dividing functionality. For example, an RF signal can be provided at one of the outermost p-doped regions (e.g., the leftmost p-doped region); and as the signal passes through the series of FETs, the signal's voltage can be divided among the FETs. In such an example, the rightmost p-doped region can act as an overall drain of the multi-finger FET device.

In some implementations, a plurality of the foregoing multi-finger FET devices can be connected in series as a switch to, for example, further facilitate the voltage-dividing functionality. A number of such multi-finger FET devices can be selected based on, for example, power handling requirement of the switch.

Examples of Implementations in Products

Various examples of FET-based switch circuits and bias/coupling configurations described herein can be implemented in a number of different ways and at different product levels. Some of such product implementations are described by way of examples.

Semiconductor Die Implementation

Figure 9A:
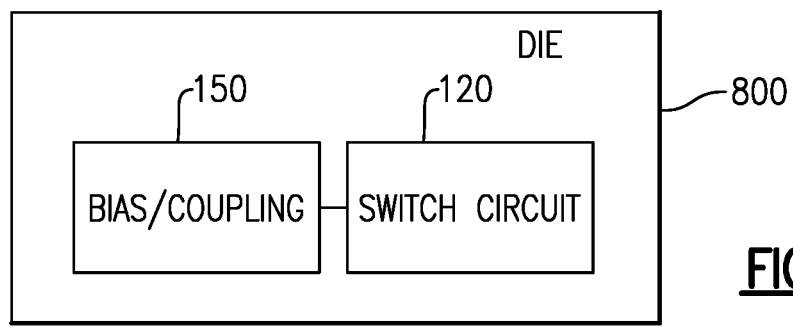
FIGS. 9A-9D schematically show non-limiting examples of various FET-based switch circuits and bias/coupling configurations.
Figure 9B:
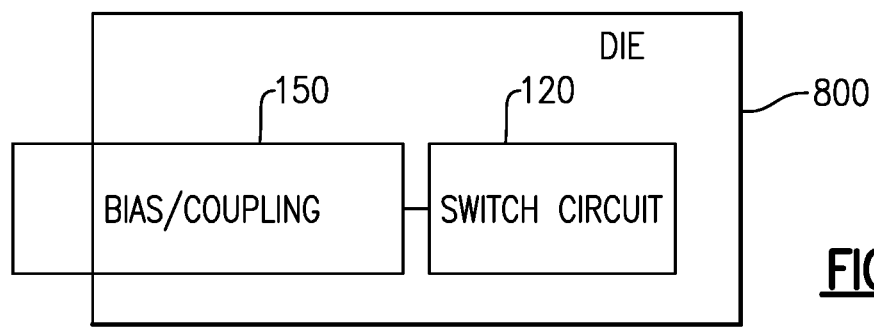

FIGS. 9A-9D schematically show non-limiting examples of such implementations on one or more semiconductor die. FIG. 9A shows that in some embodiments, a switch circuit 120 and a bias/coupling circuit 150 having one or more features as described herein can be implemented on a die 800. FIG. 9B shows that in some embodiments, at least some of the bias/coupling circuit 150 can be implemented outside of the die 800 of FIG. 9A.

Figure 9C:
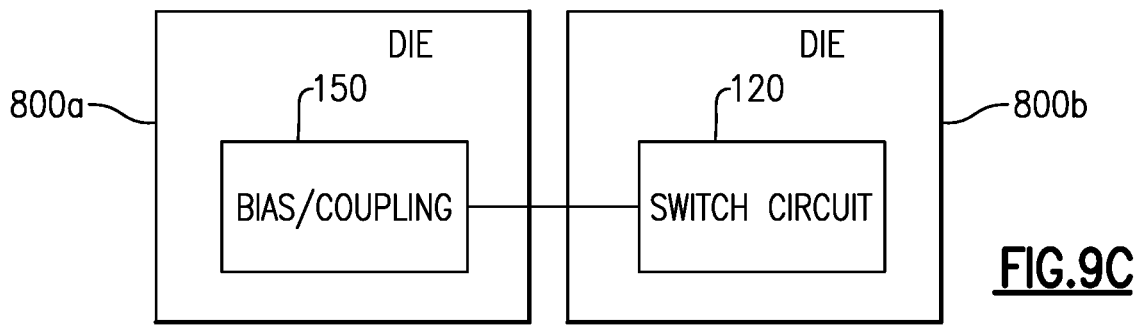
Figure 9D:
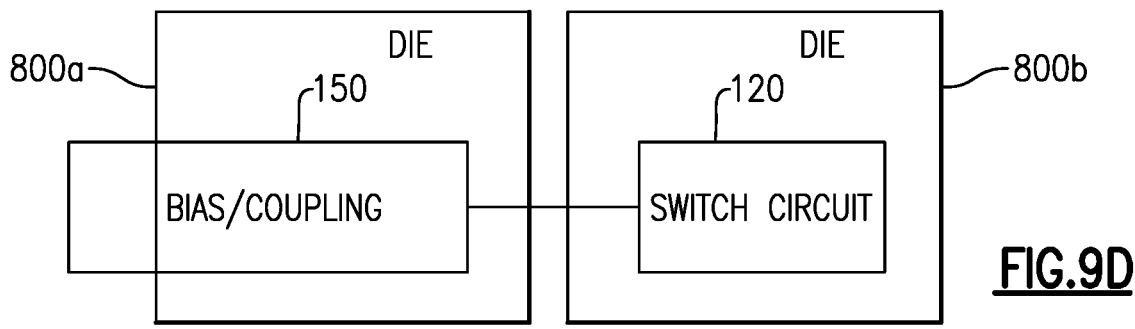

FIG. 9C shows that in some embodiments, a switch circuit 120 having one or more features as described herein can be implemented on a first die 800a, and a bias/coupling circuit 150 having one or more features as described herein can be implemented on a second die 800b. FIG. 9D shows that in some embodiments, at least some of the bias/coupling circuit 150 can be implemented outside of the first die 800a of FIG. 9C.

Packaged Module Implementation

Figure 10A:
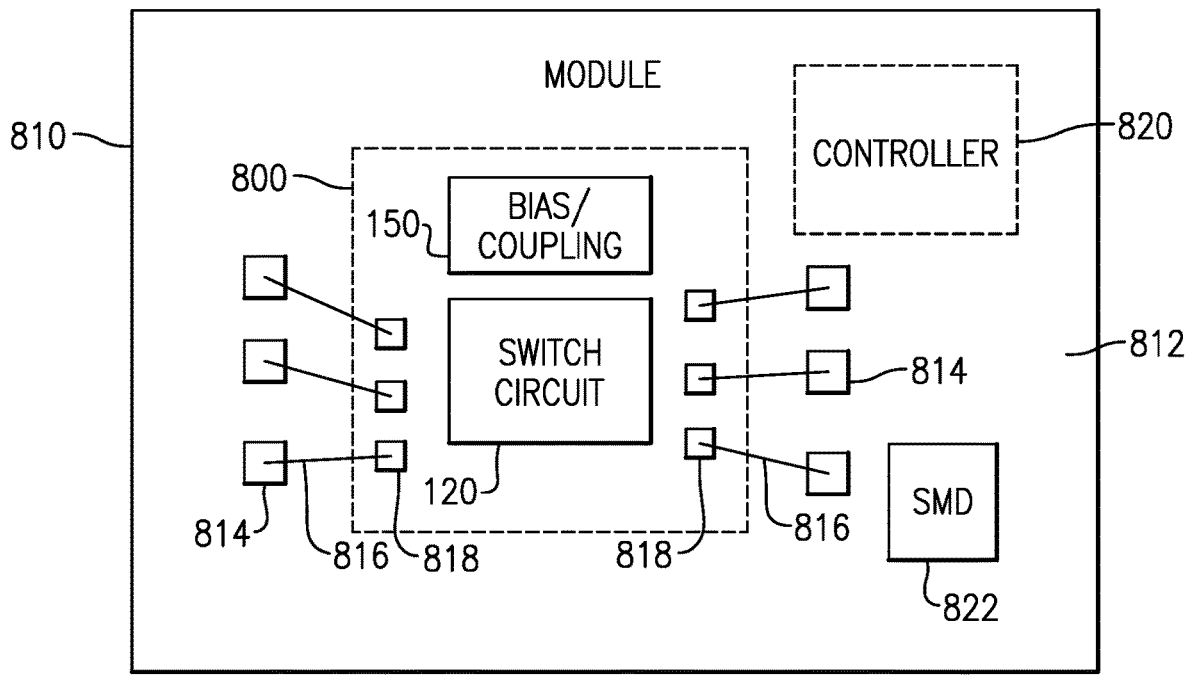
FIGS. 10A and 10B show an example of a packaged module that can include one or more features described herein.

In some embodiments, one or more die having one or more features described herein can be implemented in a packaged module. An example of such a module is shown in FIGS. 10A (plan view) and 10B (side view). Although described in the context of both of the switch circuit and the bias/coupling circuit being on the same die (e.g., example configuration of FIG. 9A), it will be understood that packaged modules can be based on other configurations.

A module 810 is shown to include a packaging substrate 812. Such a packaging substrate can be configured to receive a plurality of components, and can include, for example, a laminate substrate. The components mounted on the packaging substrate 812 can include one or more dies. In the example shown, a die 800 having a switching circuit 120 and a bias/coupling circuit 150 is shown to be mounted on the packaging substrate 812. The die 800 can be electrically connected to other parts of the module (and with each other where more than one die is utilized) through connections such as connection-wirebonds 816. Such connection-wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is depicted as interconnecting the example SMD 822 and the die 800. In another example, a connection path 832 is depicted as interconnecting the SMD 822 with an external-connection contact pad 834. In yet another example a connection path 832 is depicted as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Figure 10B:
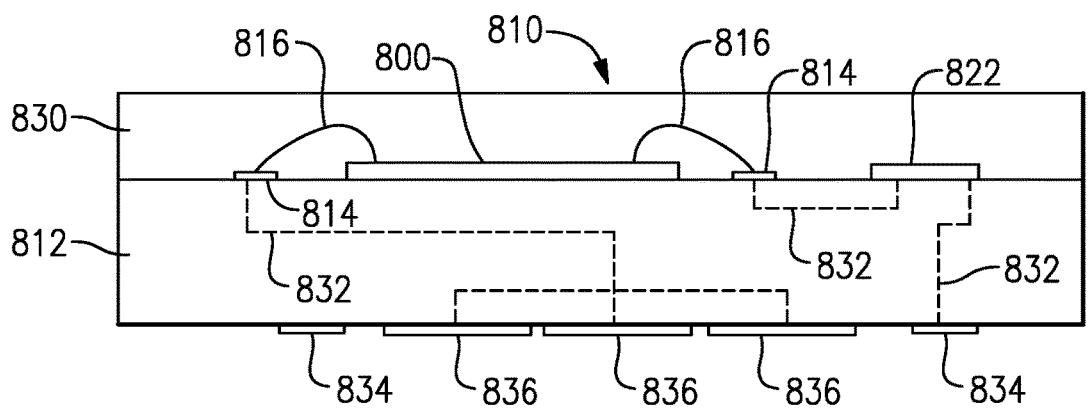
Figure 11:
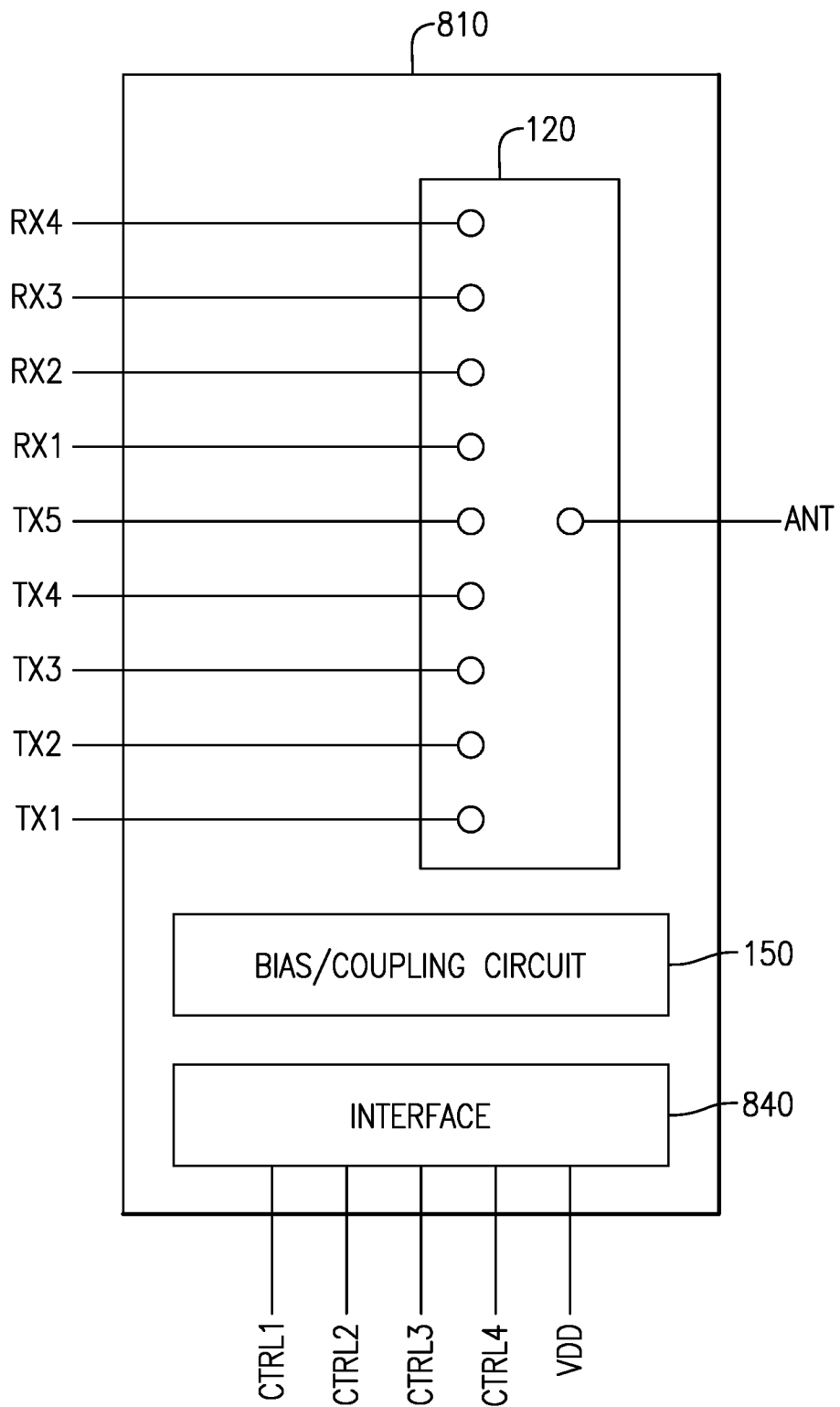
FIG. 11 illustrates that, in certain embodiments, one or more features of the present disclosure can be implemented in a switch device, such as a single-pole-multi-throw (SPMT) switch configured to facilitate multi-band multi-mode wireless operation.

FIG. 11 shows a schematic diagram of an example switching configuration that can be implemented in the module 810 described in reference to FIGS. 10A and 10B. In the example, the switch circuit 120 is depicted as being an SP9T switch, with the pole being connectable to an antenna and the throws being connectable to various Rx and Tx paths. Such a configuration can facilitate, for example, multi-mode multi-band operations in wireless devices.

The module 810 can further include an interface for receiving power (e.g., supply voltage VDD) and control signals to facilitate operation of the switch circuit 120 and/or the bias/coupling circuit 150. In some implementations, supply voltage and control signals can be applied to the switch circuit 120 via the bias/coupling circuit 150.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 12:
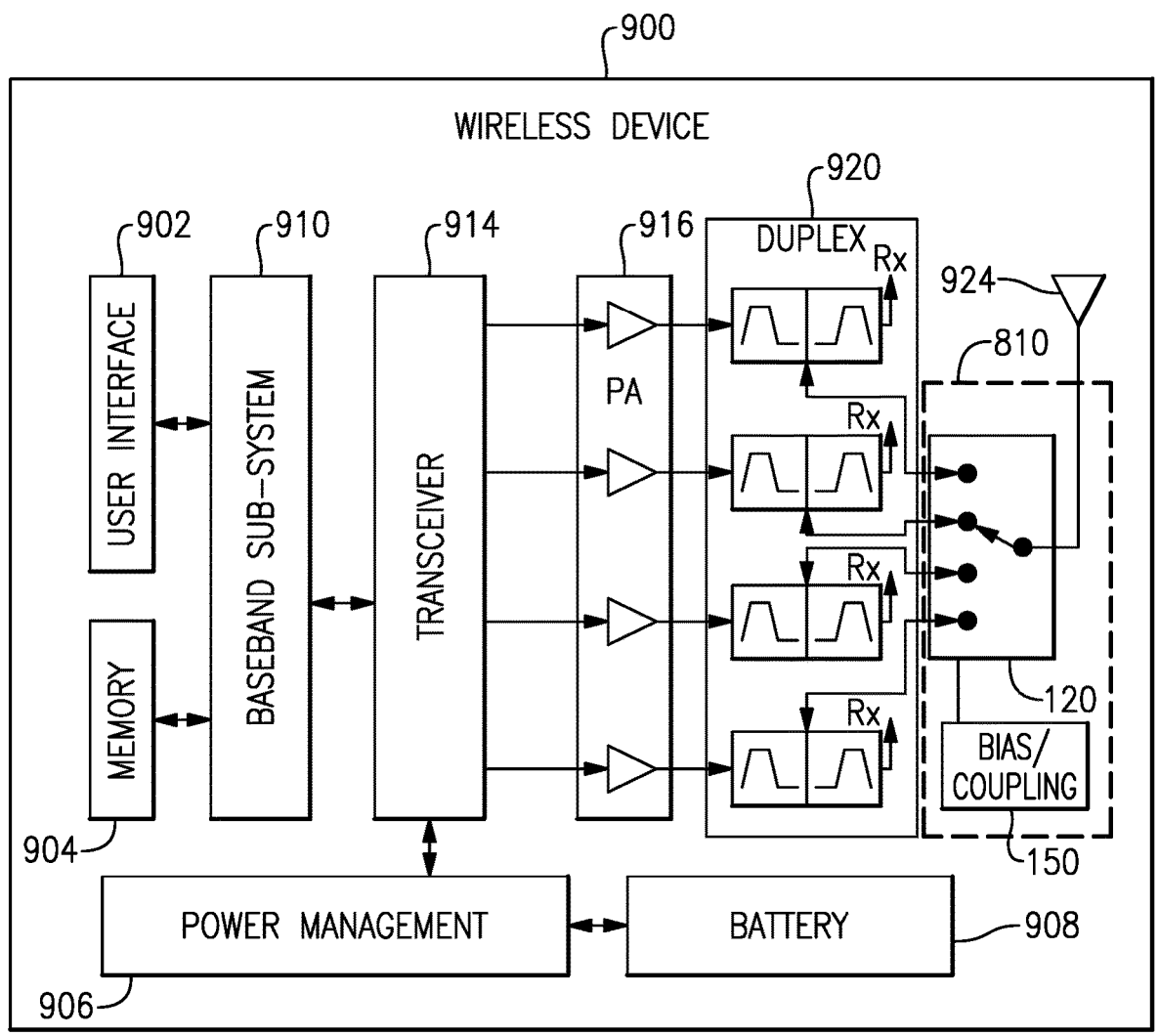
FIG. 12 illustrates an example of a wireless device that can include one or more features described herein.

FIG. 12 schematically depicts an example wireless device 900 having one or more advantageous features described herein. In the context of various switches and various biasing/coupling configurations as described herein, a switch 120 and a bias/coupling circuit 150 can be part of a module 810. In some embodiments, such a switch module can facilitate, for example, multi-band multi-mode operation of the wireless device 900.

In the example wireless device 900, a power amplifier (PA) module 916 having a plurality of PAs can provide an amplified RF signal to the switch 120 (via a duplexer 920), and the switch 120 can route the amplified RF signal to an antenna. The PA module 916 can receive an unamplified RF signal from a transceiver 914 that can be configured and operated in known manners. The transceiver can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 810.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexer 920 can allow transmit and receive operations to be performed simultaneously using a common antenna (e.g., 924). In FIG. 12, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Impedance Matching

One application of the previously described switches, which may be based on one or more FETs, such as silicon-on-insulator (SOI) FETs, is for impedance matching circuits. It is often desirable to match impedance between circuit elements. For example, it is often desirable to match the impedance of an antenna with subsequent circuitry, such as an amplifier circuit (e.g., a power amplifier module or a low noise amplifier (LNA)). One reason for matching the impedance of the circuit elements is to obtain the maximum power transfer between elements. For instance, if a circuit has a 50Ω source on one end and a 100Ω load on the other end of the circuit, the power transfer between the circuit elements may be less than maximum. One way to match the impedance between circuit elements is to insert an impedance matching circuit between the circuit elements. Although this disclosure may be useful in a number of environments and with a number of different types of circuit and/or device elements, to simplify discussion much of the remainder of this disclosure will focus on examples of using the impedance matching circuit between an antenna and a subsequent circuit, such as a LNA.

Figure 13:
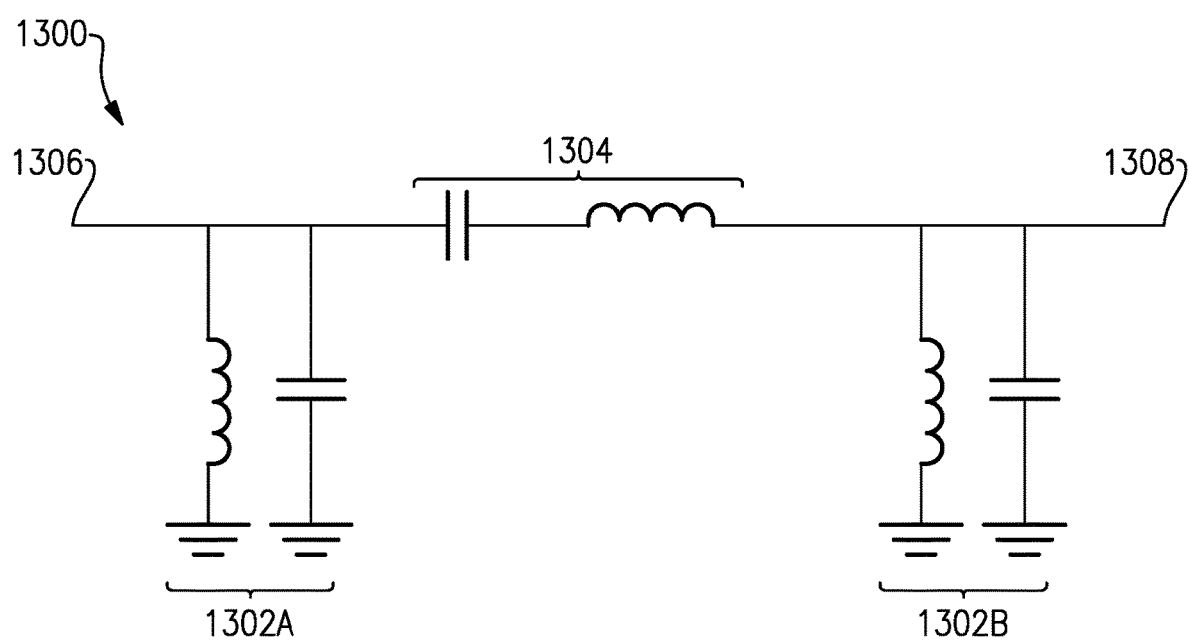
FIG. 13 illustrates an example of an impedance matching circuit.

One example of an impedance matching circuit is illustrated in FIG. 13. The impedance matching circuit 1300 of FIG. 13 is an example of a π circuit that may be used for impedance matching. The impedance matching circuit 1300 may include a series element 1304 that connects one circuit or device element to another circuit or device element. For example, an antenna may be connected to the impedance matching circuit 1300 at node 1308 and an amplifier may be connected at node 1306.

Further, as illustrated, the impedance matching circuit 1300 may include two shunt elements 1302A, 1302B on either side of the series element 1304 giving the configuration a π configuration. The shunt elements 1302A, 1302B may include circuit elements that are connected to ground. Each of the series element 1304 and the shunt elements 1302A, 1302B may be LC circuits as illustrated in FIG. 13. Further, the shunt elements 1302A, 1302B may be configured as Tank circuits, or with the inductors and capacitors in parallel. However, other circuits may be used for both the series element 1304 and one or both of the shunt elements 1302A, 1302B. For instance, one or both of the shunt elements may include an inductor, or L-based circuits, C-based circuits, or other configurations of the LC circuits.

In some embodiments, one or more of the capacitors included with the series element 1304 and the shunt elements 1302A, 1302B may be tunable capacitors. The tunable capacitors may include any number of capacitor elements that may contribute to the capacitance of the series element 1304, or shunt elements 1302A, 1302B. Thus, although one capacitor is illustrated in FIG. 13 for each of the elements of the impedance matching circuit 1300, each element may include multiple capacitors, which may be combined in series, parallel, or otherwise. The contribution of the capacitors may be modified by opening and closing switches (not shown) between the capacitors. The tunable capacitors may be switched binary weighted capacitors, analog tunable capacitors, digital switch capacitors or digital switched capacitors, digital step capacitors, or a combination thereof.

Advantageously, in certain embodiments, using tunable capacitors enables the impedance matching circuit 1300 to be configured and reconfigured to match changing impedances. For example, the impedance of the antenna of a wireless device may change based on the frequency of a received signal or the location of the wireless device with respect to external objects or users. For instance, the antenna of a phone or other wireless device on a desk may have a different impedance than when the wireless device is held by a user in the user's hand or against the user's head. Further, other conditions of the wireless device may also result in impedance changes in the components of the wireless device. For example, temperature changes may alter the impedance of one or more components of the wireless device. As a second example, the physical configuration state of the wireless device (e.g., opened or closed keypad cover) may change the impedance of, for instance, the antenna.

It is often the case that the impedance of a circuit can be matched using one shunt element. For instance, typically, the shunt element is used for the node that is connected to the circuit element (e.g., amplifier) that has the higher impedance. However, it is often the case that the node connected to the higher impedance element will change. For example, during some time periods, an amplifier connected to node 1306 may have a higher impedance than an antenna connected to node 1308, and during other time periods, the amplifier connected to node 1306 may have a lower impedance than the antenna connected to node 1308. Thus, the impedance matching circuit 1300 includes a shunt element 1302A in communication with node 1306 and another shunt element 1302B in communication with node 1308. The active shunt element may be selected using switches (not shown). The inclusion of the extra shunt element, because of the need, in some cases, to have a shunt element available on either end (e.g., node 1306 or node 1308) of the impedance matching circuit 1300, results in the use of extra inductors and capacitors. The inclusion of extra capacitors and inductors can increase both the size and cost of the impedance matching circuit 1300.

Example L-Network Impedance Matching Circuits

Figure 14:
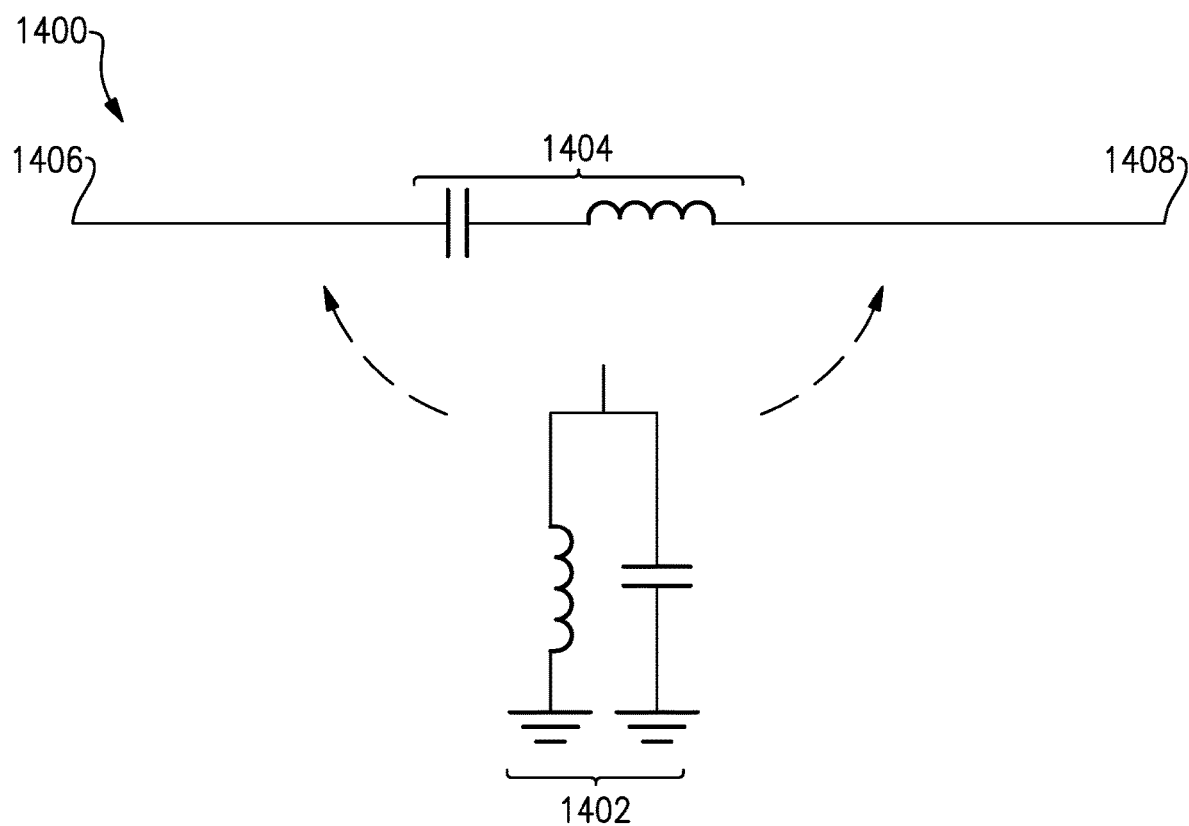
FIG. 14 illustrates an example of an L-network based impedance matching circuit.

FIG. 14 illustrates an example of an L-network based impedance matching circuit 1400. The impedance matching circuit 1400 may be referred to as an L-network because in some cases, the circuit may resemble a letter '1' in contrast to a 7 network. In certain embodiments, the impedance matching circuit 1400 can be used in place of the impedance matching circuit 1300 and may include the same performance as the impedance matching circuit 1300. Advantageously, the impedance matching circuit 1400 includes one shunt element 1402 in place of the two shunt elements of the impedance matching circuit 1300. Thus, the impedance matching circuit 1400 may use less capacitors and/or inductors than the impedance matching circuit 1300 saving on both cost and space.

As with the impedance matching circuit 1300, the impedance matching circuit 1400 may include a series element 1404 and a pair of nodes 1406, 1408 capable of communicating with elements of a wireless device that may have different impedances. As indicated by the dashed line arrows, the shunt element 1402 may be connected to either the node 1406 or the node 1408 using switches (not shown). As with the impedance matching circuit 1300, the capacitors of the shunt element 1402 and of the series element 1404 may be tunable capacitors and may each include a set of capacitors. For instance, the tunable capacitors may include five capacitors that can each be separately connected or disconnected from the impedance matching circuit 1400 resulting in 32 different capacitance values for the tunable capacitors.

In some embodiments, the impedance matching circuit 1400 may include one or more additional elements. For example, there may be one or more resistors included as part of the tunable capacitors, or elsewhere in the impedance matching circuit 1400.

Figure 15:
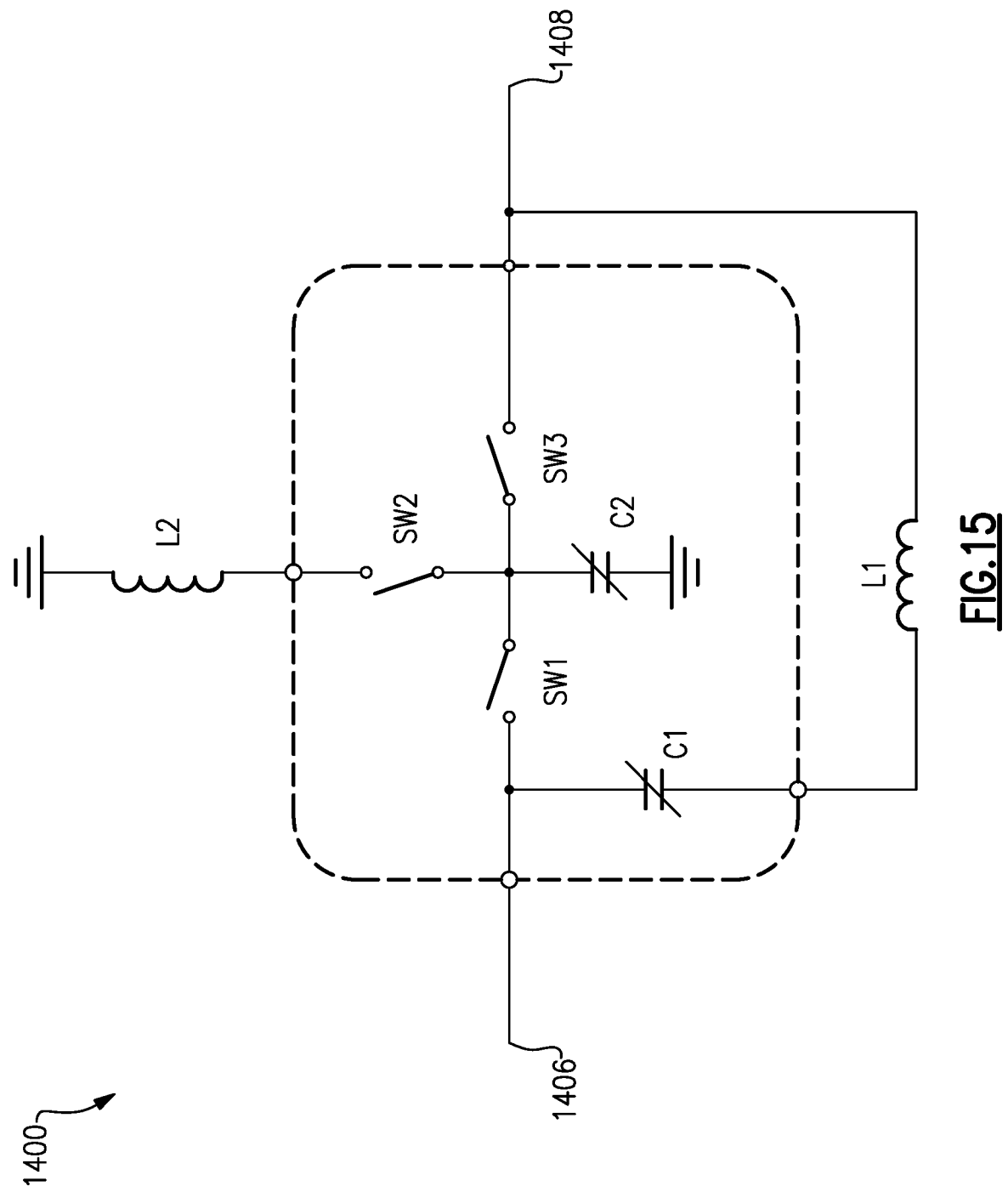
FIG. 15 illustrates an alternative representation of the impedance matching circuit illustrated in FIG. 14.

FIG. 15 illustrates an alternative representation of the impedance matching circuit 1400. As illustrated, the impedance matching circuit 1400 may include three switches SW1, SW2, SW3 that may be used to configure the impedance matching circuit so that the shunt element 1402, which includes L2 and C2, may be connected to either node 1406, node 1408, or may be excluded altogether from contributing to the impedance matching circuit 1400. The series element 1404 is represented by C1 and L1 in the FIG. 15.

Figure 16A:
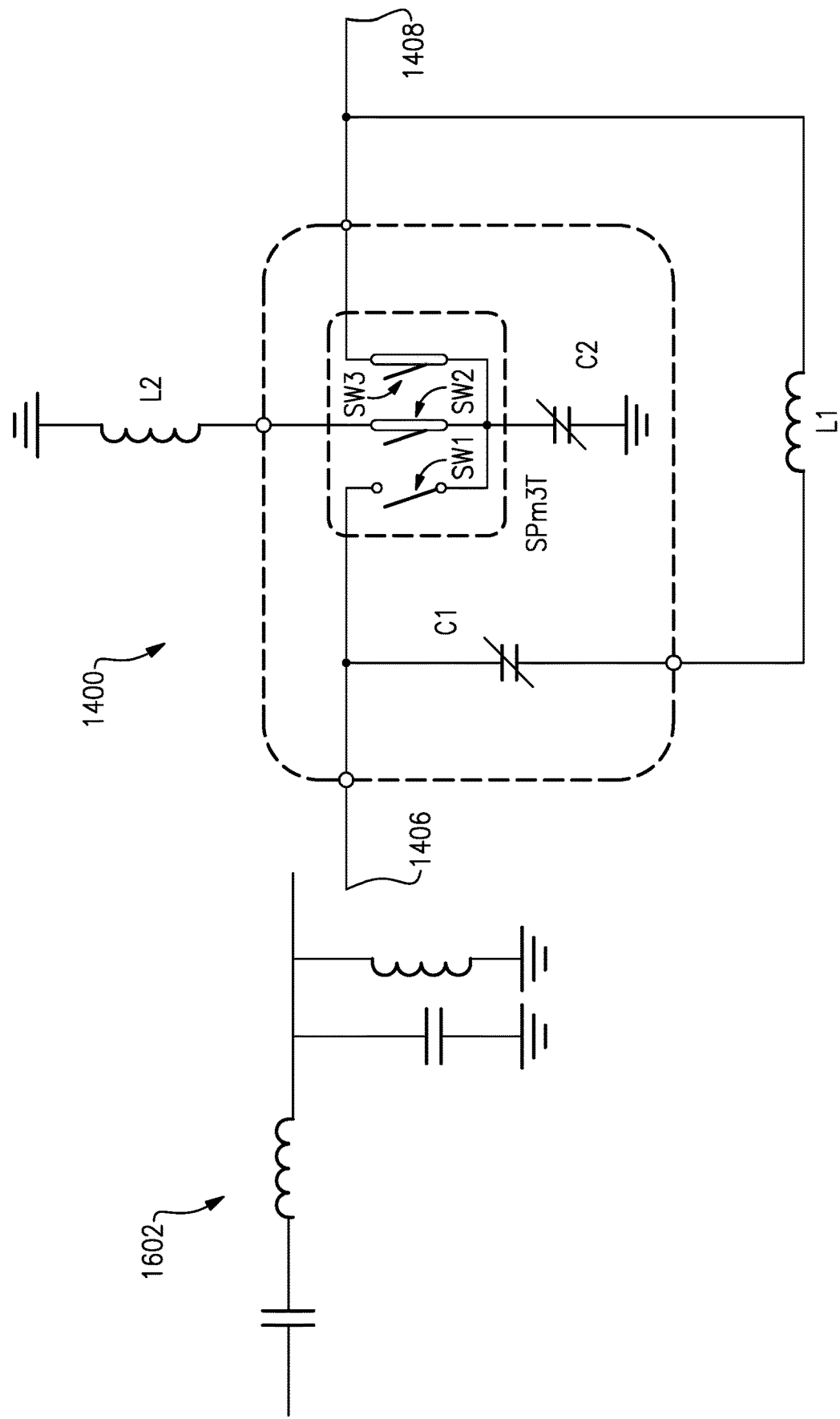
FIGS. 16A and 16B illustrate the switch configurations for the impedance matching circuit of FIG. 14 that effectively moves the shunt element from one node to the other node by modifying the electrical connections.
Figure 16B:
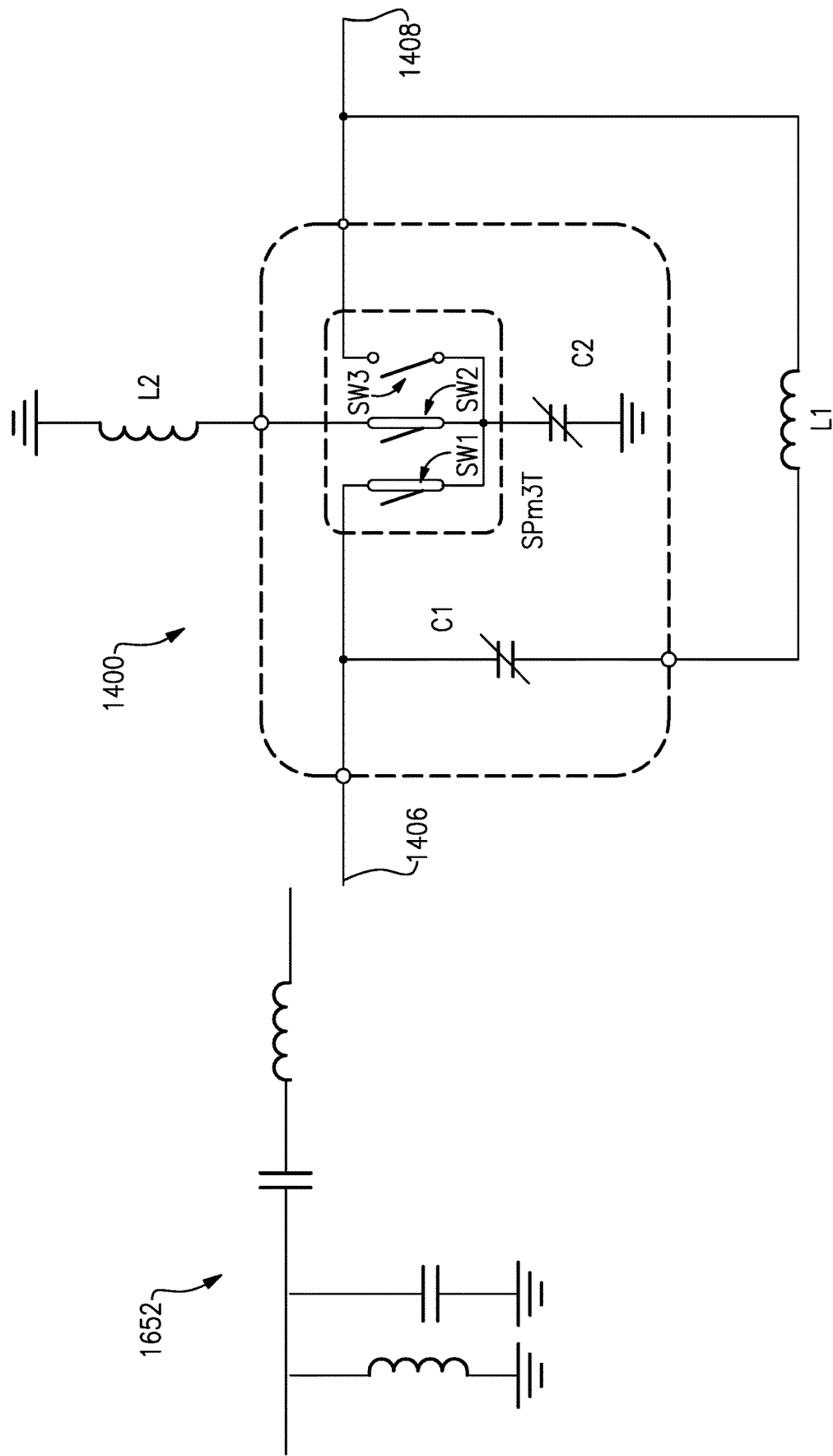

FIGS. 16A and 16B illustrate the switch configurations for the impedance matching circuit 1400 to move the shunt element from one node to the other node. In certain embodiments, the shunt element is moved by modifying the electrical connections between the elements that comprise the impedance matching circuit 1400. FIG. 16A illustrates the case where the element in communication with the node 1408 is of a higher impedance than the element in communication with the node 1406. In such a case, the switches SW2 and SW3 may be closed, and the switch SW1 may be left open resulting in the shunt element being in communication with the node 1408. An equivalent circuit diagram 1602 illustrates the configuration of the impedance matching circuit 1400 as configured in FIG. 16A.

FIG. 16B illustrates the case where the element in communication with the node 1406 has a higher impedance than an element that may be in communication with the node 1408. In such a case, the switches SW1 and SW2 may be closed, and the switch SW3 may be left open resulting in the shunt element being in communication with the node 1406. An equivalent circuit diagram 1652 illustrates the configuration of the impedance matching circuit 1400 as configured in FIG. 16B. The switches SW1, SW2, SW3 may be single pole single throw switches. Alternatively, the switches may be other switch types that can result in the described circuit configurations. For example, the switches SW1 and SW2 may be created using a single pole triple throw switch.

Additional Example L-Network Configurations

As previously described, the impedance matching circuit 1400 may apply a shunt circuit to either node 1406 or node 1408 with a series element 1404 in between the two nodes. Advantageously, by adjusting the combination of open and closed switches, the impedance matching circuit 1400 may be used to create other circuit configurations. FIGS. 17A-17D illustrate four examples of additional circuit configurations that may be created using the L-network impedance matching circuit 1400.

Figure 17A:
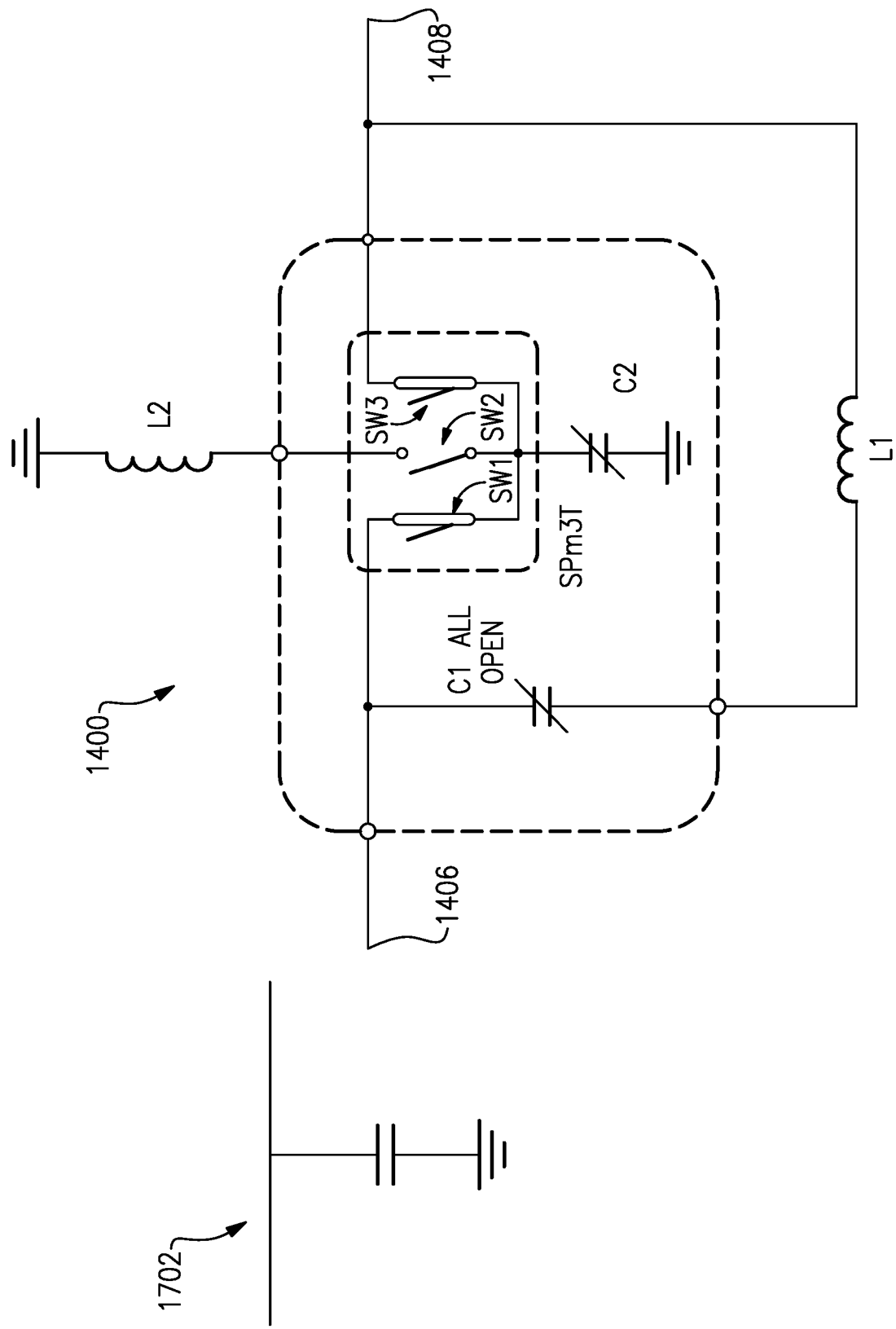
FIGS. 17A-17D illustrate four examples of additional circuit configurations that may be created using the L-network impedance matching circuit illustrated in FIG. 14.

FIG. 17A illustrates a case where a single capacitor, which may be a set of one or more capacitors configured as a binary weighted digital switch capacitor to give a particular capacitance value, is connected between the nodes 1406 and 1408. To achieve this configuration, represented by equivalent circuit diagram 1702, the switches SW1 and SW3 are closed while the switch SW2 is opened. Further, the one or more switches associated with the binary weighted digital switch capacitor C1 are configured in the open position. This configuration illustrated in FIG. 17A results in the binary weighted digital switch capacitor C1 being applied between node 1406 and node 1408 via the closed switches SW1 and SW3.

Figure 17B:
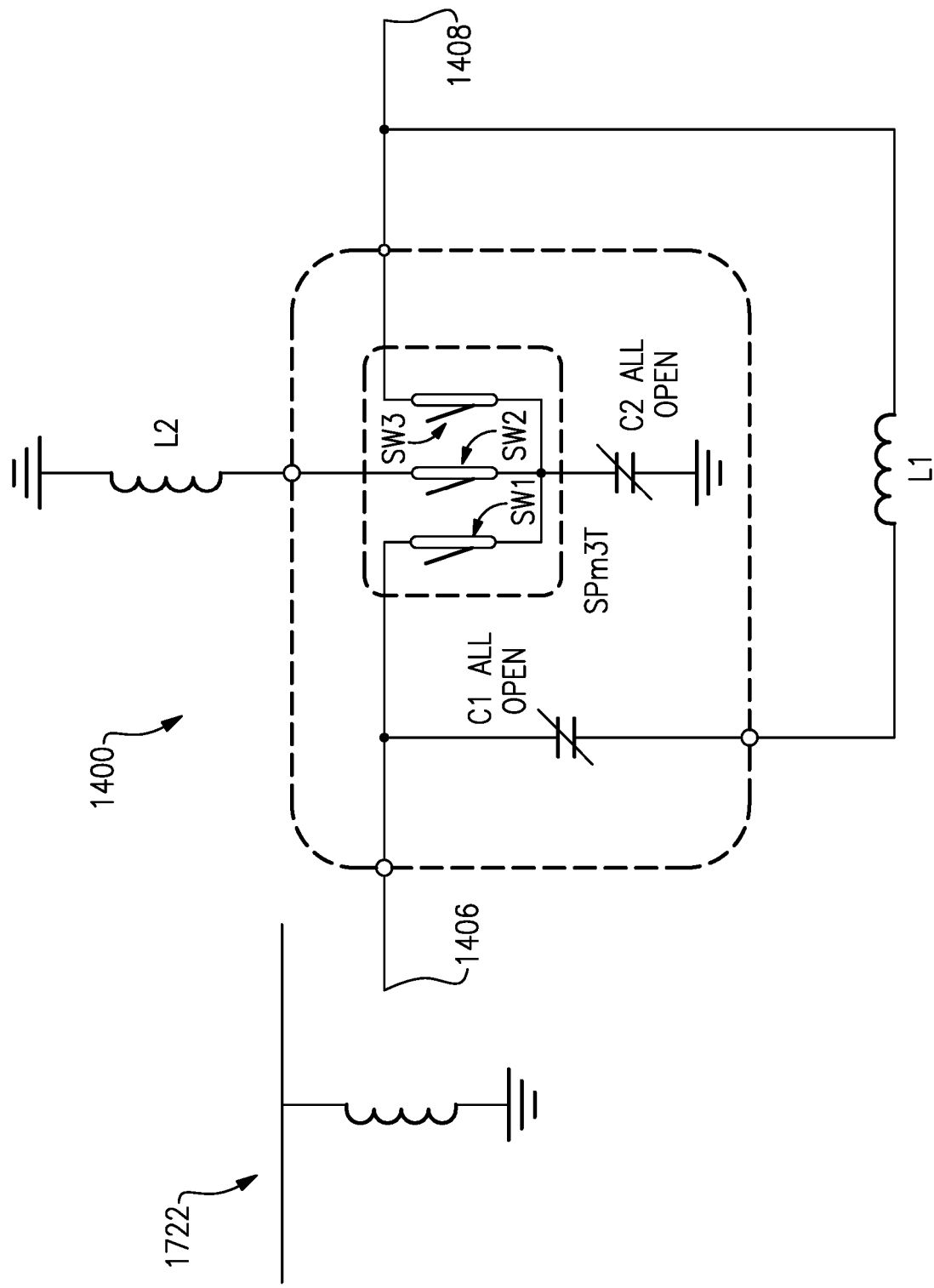

FIG. 17B illustrates a case where a single inductor, which may be a set of one or more inductors configured to provide a particular inductance value, is connected between the nodes 1406 and 1408. To achieve this configuration, represented by equivalent circuit diagram 1722, the switches SW1, SW2, and SW3 are closed. Further, the one or more switches associated with the binary weighted digital switch capacitors C1, C2 are configured in the open position. This configuration illustrated in FIG. 17B results in the inductor L2 being applied between node 1406 and node 1408 via the closed switches SW1, SW2, and SW3.

Figure 17C:
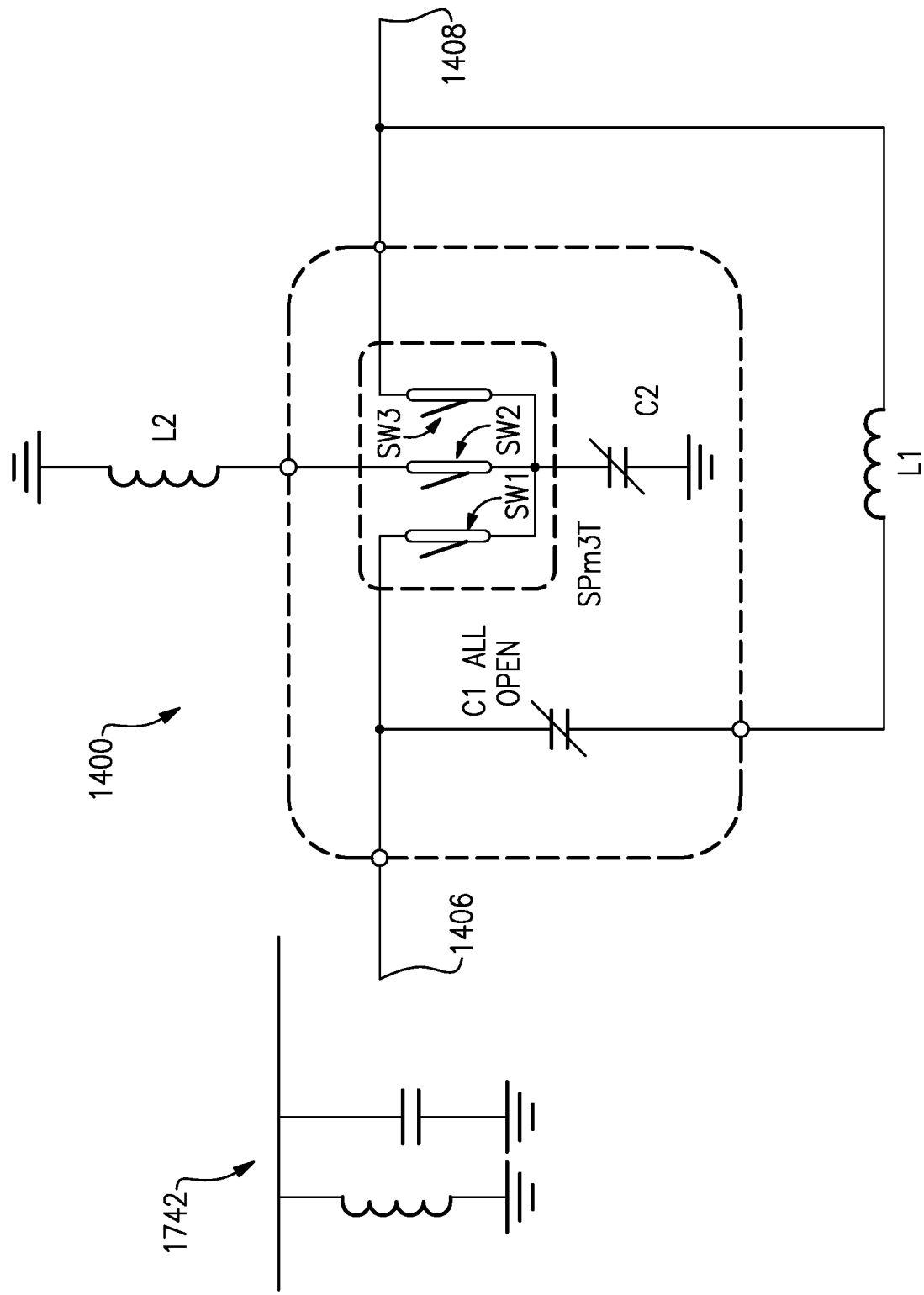

FIG. 17C illustrates a case where a Tank circuit, which may include a set of one or more capacitors configured as a binary weighted digital switch capacitor to give a particular capacitance value in parallel with a set of one or more inductors configured to provide a particular inductance value, is connected between the nodes 1406 and 1408. To achieve this configuration, represented by equivalent circuit diagram 1742, the switches SW1, SW2, and SW3 are closed. Further, the one or more switches associated with the binary weighted digital switch capacitors C1 are configured in the open position. This configuration illustrated in FIG. 17C results in the capacitor C2 and the inductor L2 being applied between node 1406 and node 1408 via the closed switches SW1, SW2, and SW3.

It is of note that the equivalent circuit diagram 1742 may represent the shunt circuit 1402. As illustrated in FIG. 17C, as well as in FIG. 14, this shunt circuit 1402 may be a Tank circuit. However, as previously described, the shunt circuit 1402 is not limited as such. The shunt circuit 1402 may include a number of circuit configurations and may include a number of different circuit elements. Thus, as the configuration illustrated in FIG. 17C results in the shunt circuit 1402 being connected between node 1406 and node 1408, the configuration illustrated in FIG. 17C may result in a number of other equivalent circuits between node 1406 and node 1408 besides the equivalent circuit illustrated by the equivalent circuit diagram 1742.

Figure 17D:
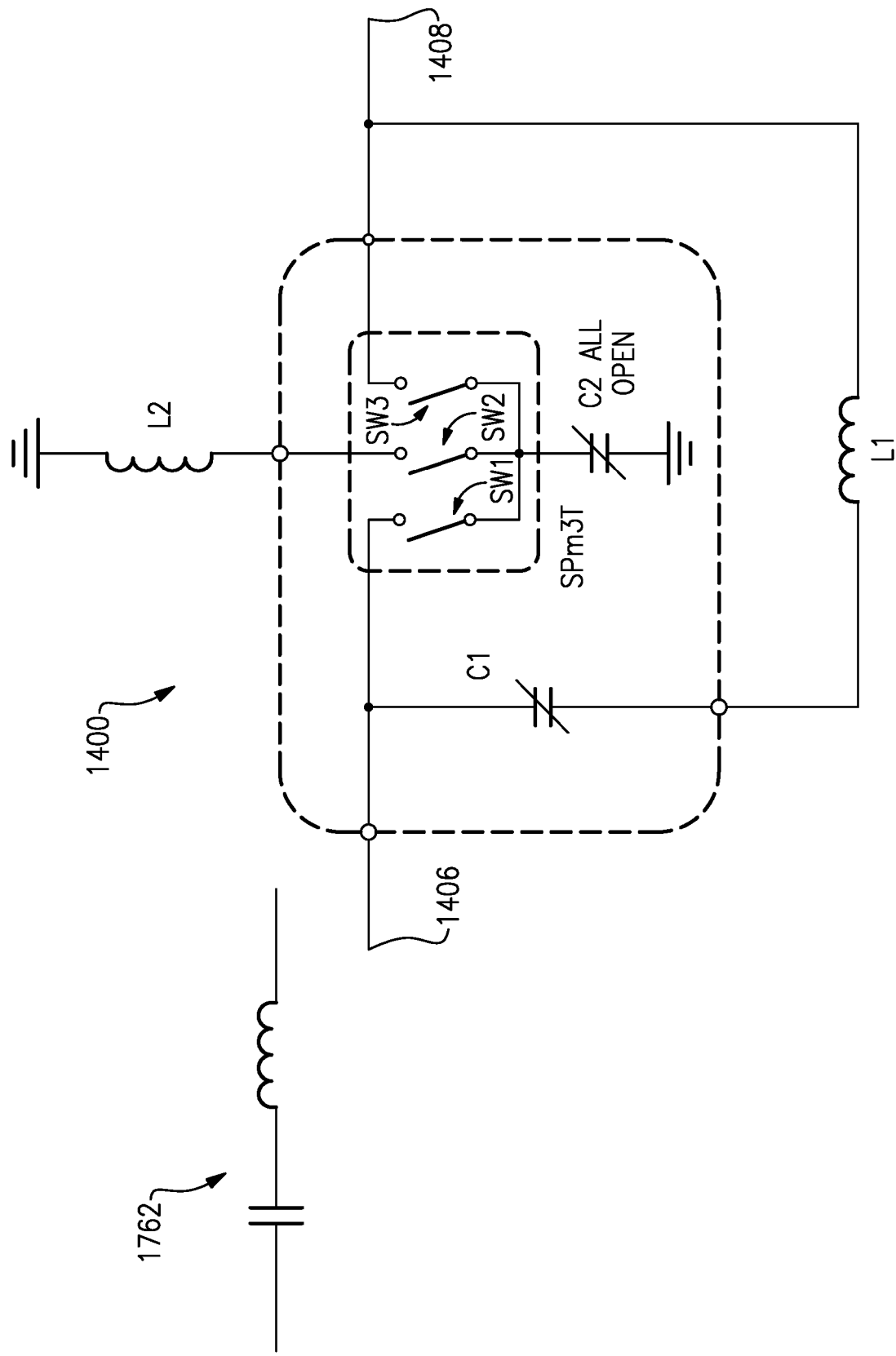

FIG. 17D illustrates a case where a capacitor, which may include a set of one or more capacitors configured as a binary weighted digital switch capacitor to give a particular capacitance value, and an inductor, which may include a set of one or more inductors configured to provide a particular inductance value, are connected in series between the nodes 1406 and 1408. To achieve this configuration, represented by equivalent circuit diagram 1762, the switches SW1, SW2, and SW3 are opened. Further, the one or more switches associated with the binary weighted digital switch capacitors C2 may be configured in the open position, as illustrated in FIG. 17D, or may be configured in any other position. This configuration illustrated in FIG. 17D results in the capacitor C1 and the inductor L1 being applied between node 1406 and node 1408.

Additional Example L-Network Impedance Matching Circuit

Figure 18:
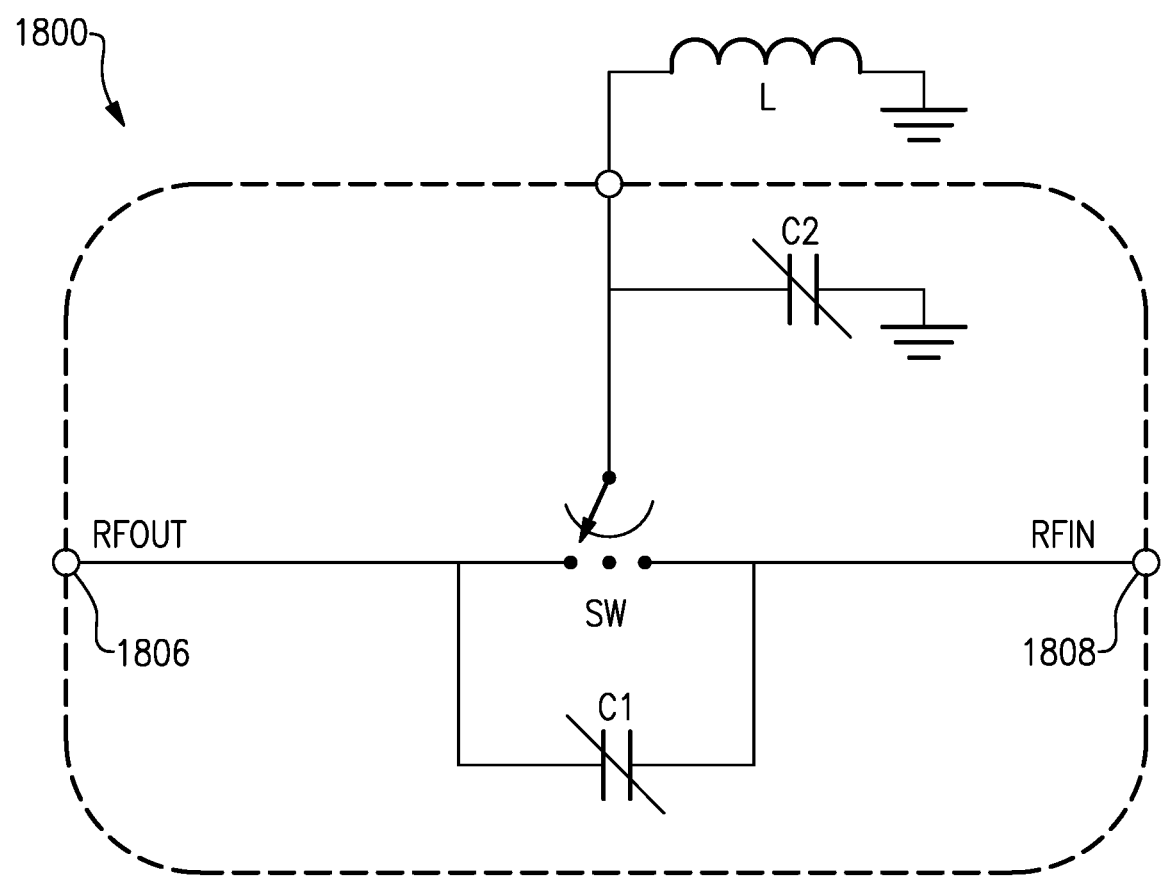
FIG. 18 illustrates another example of an L-network impedance matching circuit.

FIG. 18 illustrates another example of an L-network impedance matching circuit 1800. In certain embodiments, the impedance matching circuit 1800 may include some or all of the embodiments described above with respect to the impedance matching circuit 1400.

Similar to the impedance matching circuit 1400, the impedance matching circuit 1800 may include a node 1806 and a node 1808. As illustrated in FIG. 18, the node 1808 may be a Radio Frequency (RF) input, such as from an antenna, and the node 1806 may be an RF output, such as to a filter or an amplifier. Further, in some cases, the nodes 1806 and 1808 may be reversed. In other words, the node 1806 may be the RF input and the node 1808 may be the RF output. Moreover, in some cases, the nodes 1806 and 1808 may be configured as both inputs and outputs depending, for example, on a state of operation of the device including the impedance matching circuit 1800.

In addition, as with the impedance matching circuit 1400, the impedance matching circuit 1800 may include a shunt circuit, such as a Tank circuit. In the example illustrated in FIG. 18, the shunt circuit is represented by the inductor L which in some cases may include a set of one or more inductors configured to provide a particular inductance value, and the capacitor C2, which in some cases may include a set of one or more capacitors configured as a binary weighted digital switch capacitor to give a particular capacitance value. As previously described, in some cases the capacitor (e.g., the capacitor C2) may be an analog tunable capacitor. The switch SW may be a single pole three throw SP3T switch enabling the shunt circuit to be connected to either the node 1806 or the node 1808. Further, in some cases, the switch SW may be configured to prevent the shunt circuit from being connected to both the nodes 1806 and 1808.

In certain embodiments, the impedance matching circuit 1800 may include a capacitor C1, which in some cases may include a set of one or more capacitors configured as a binary weighted digital switch capacitor to give a particular capacitance value, located between the nodes 1806 and 1808. As previously described, the impedance matching circuit may include an inductor in series with the capacitor C1. However other circuit configurations are possible. For example, as illustrated in FIG. 18, the additional inductor, or set of inductors, in series with the capacitor C1 may be excluded from the impedance matching circuit.

Example L-Network Impedance Matching Circuit Simulation

Figure 19:
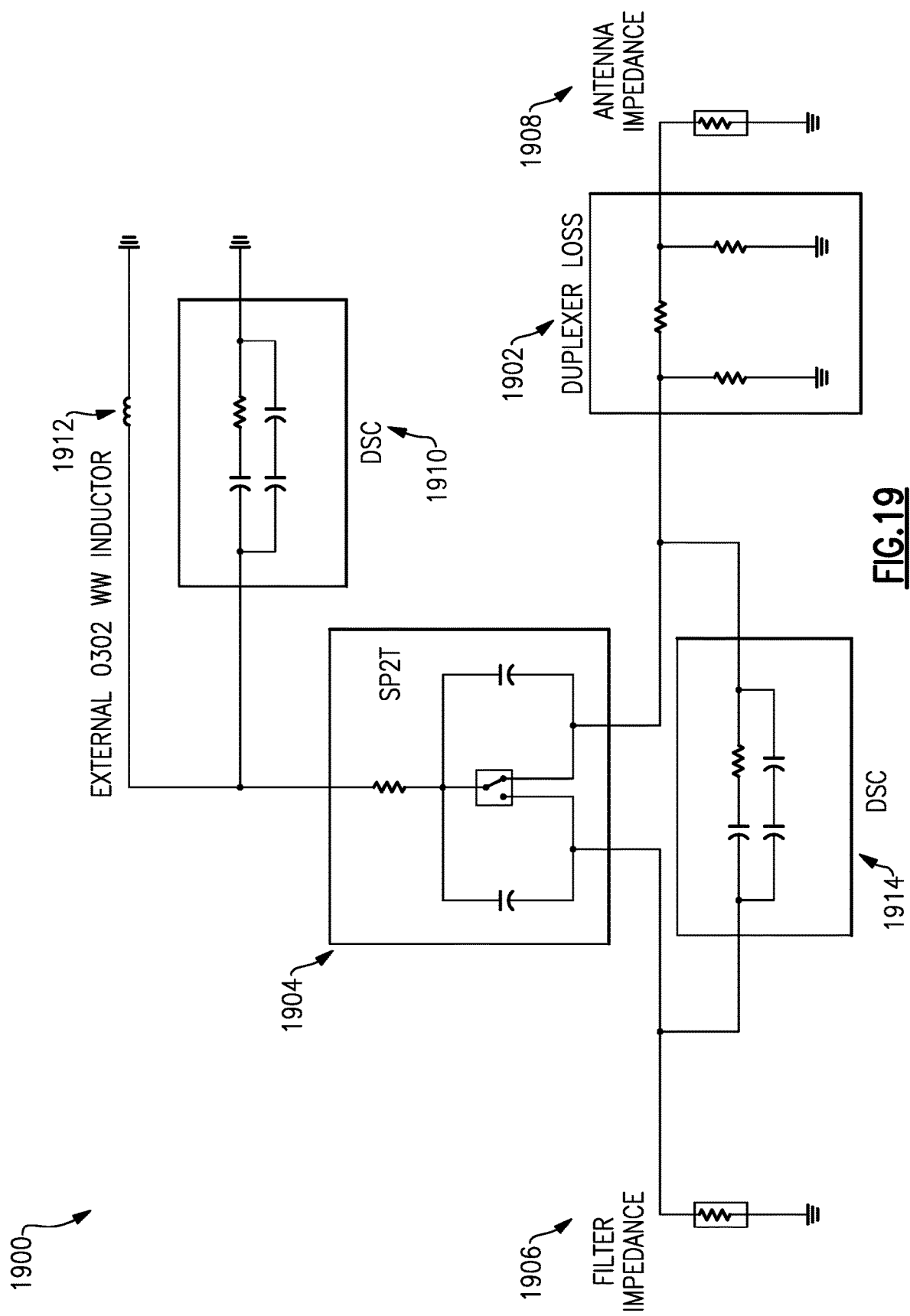
FIG. 19 illustrates an example of a circuit simulation for an L-network impedance matching circuit.

FIG. 19 illustrates an example of a circuit simulation 1900 for an L-network impedance matching circuit. The circuit simulation 1900 simulates a version of the impedance matching circuit 1800 with an additional optional Duplexer loss circuit 1902 and a single pole two throw (SP2T) switch 1904.

The circuit simulation 1900 may include a node 1906 representing a filter impedance and a node 1908 representing an antenna impedance in this particular example. The node 1906 may further be in communication with an amplifier, which may be subsequent to the filter. Further, the circuit simulation may include a shunt circuit including a digital switching capacitor (DSC) 1910 and an inductor 1912. This shunt circuit, as previously described, may be switched between the nodes 1906 and 1908 by the switch 1904. Moreover, the circuit simulation may include a second DSC 1914 connected between the nodes 1906 and 1908.

Figure 20:
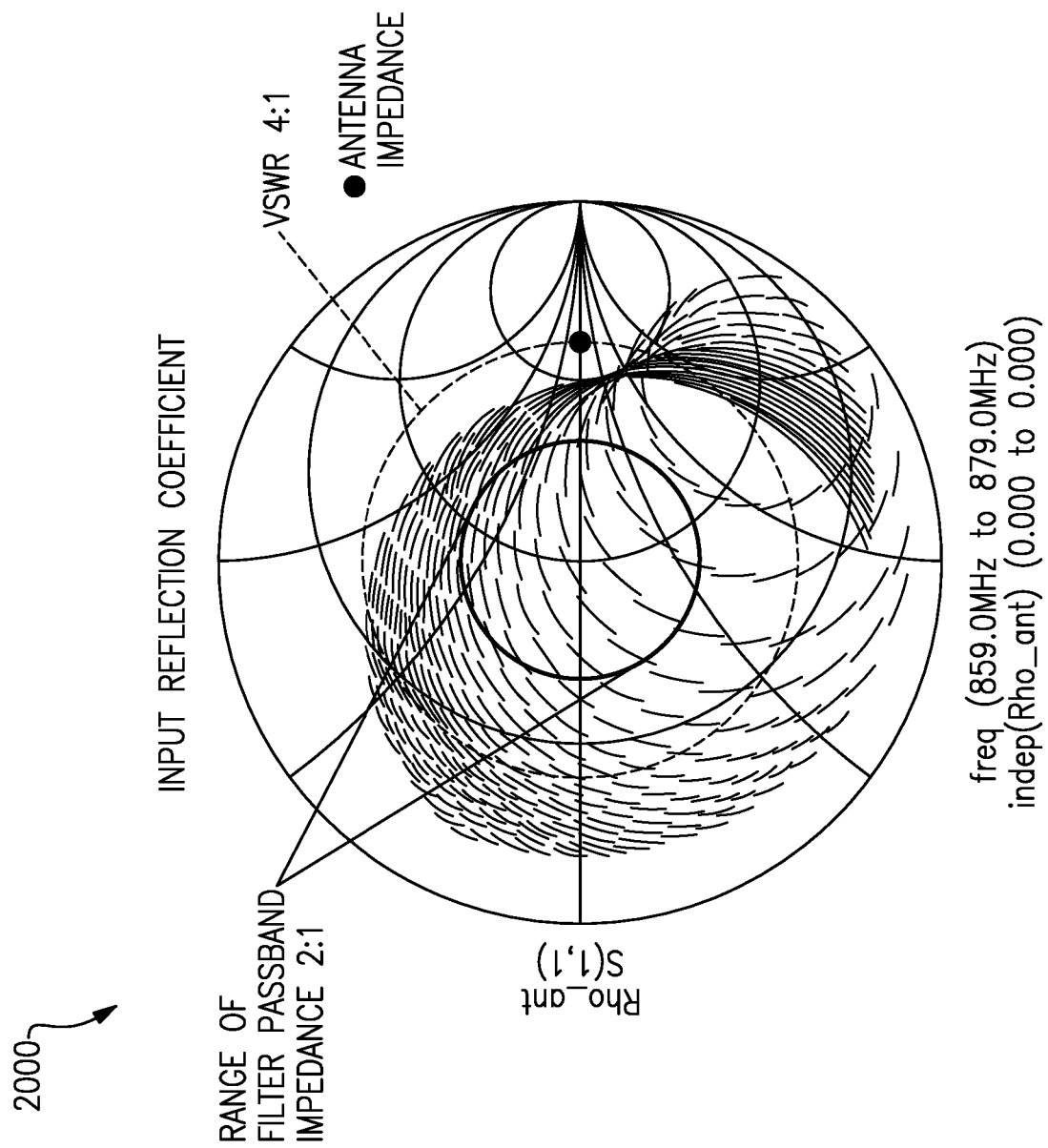
FIG. 20 illustrates a Smith chart illustrating impedance matching using the circuit simulation of FIG. 19.

FIG. 20 illustrates a Smith chart 2000 illustrating impedance matching using the circuit simulation 1900 with a 50Ω impedance on one side of the impedance matching circuit and a 200Ω impedance on the other side of the impedance matching circuit.

Example L-Network with Bypass Modes

Figure 21:
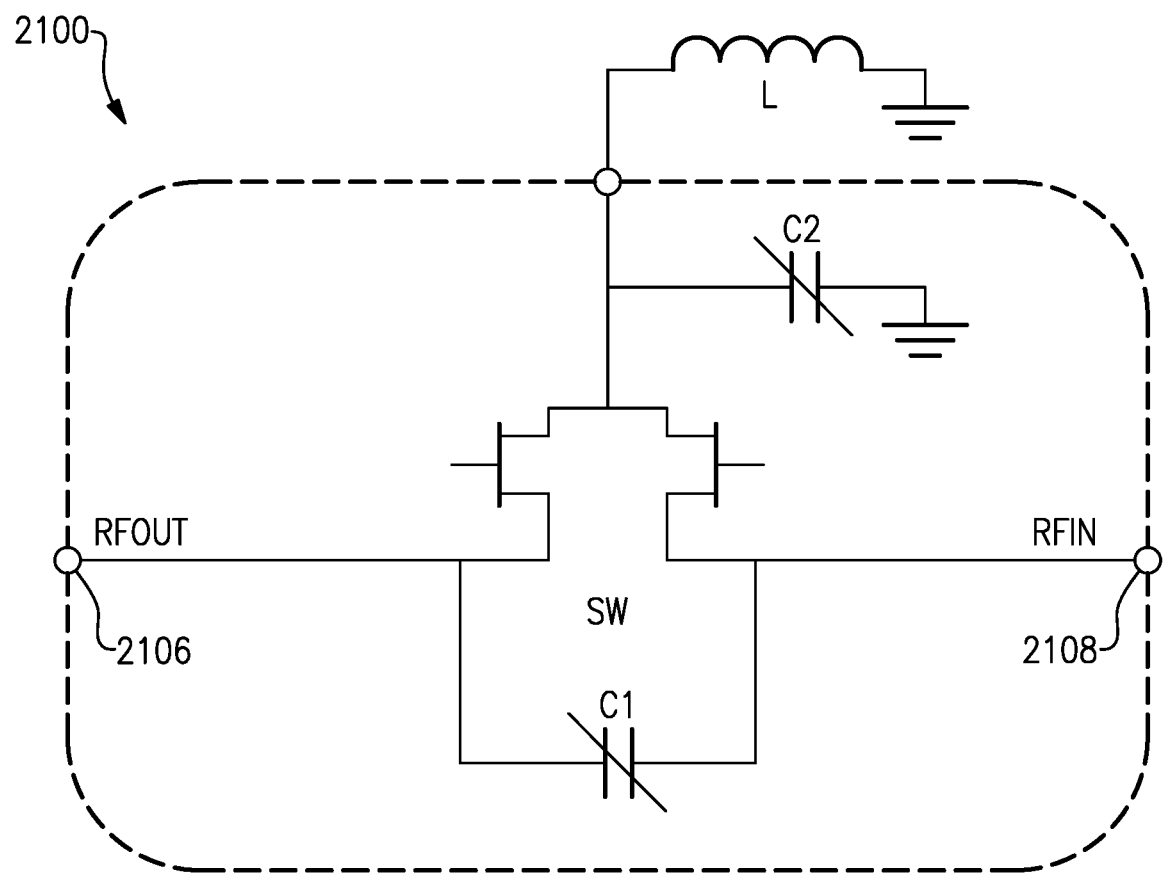
FIG. 21 illustrates an example of an L-network impedance matching circuit capable of bypass modes.

FIG. 21 illustrates an example of an L-network impedance matching circuit 2100 capable of bypass modes. In certain embodiments, the impedance matching circuit 2100 may include some or all of the embodiments described above with respect to the impedance matching circuits 1400 and 1800. Further, as with the impedance matching circuits 1400 and 1800, the impedance matching circuit 2100 may include a pair of nodes 2106 and 2108 for electrically communicating with circuits or devices of a wireless device, or otherwise, with impedances that may, at least in some cases, be mismatched. Further, as previously described with respect to the impedance matching circuits 1400 and 1800, the impedance matching circuit 2100 may include a capacitor C1 between the nodes 2106 and 2108, and a shunt circuit, which may include the capacitor C2 and the inductor L.

In addition, the impedance matching circuit 2100 may include a switch SW. As illustrated in FIG. 21, the switch SW may be composed, at least in part, of transistors. The transistors may be FETs or any other type of transistor. Further, as described above, the FETs may be SOI FETs. However, there transistors are not limited as such and may be implemented using a number of transistor types of implementation technologies for implementing transistors and/or switches.

The switch SW may be configured to connect the shunt circuit (e.g., the LC2 circuit) to either the node 2106 or the node 2108. Further, in some cases, the switch SW may be set to a bypass mode. In the bypass mode a signal entering the RF input port (e.g., the node 2108 in the example of FIG. 21) may pass to the RF output port (e.g., the node 2108 in the example of FIG. 21).

In the example of FIG. 21, two bypass modes are possible. In the first bypass mode, both transistors, or switches, of the switch SW are closed, the signal may be shorted between the RF input and the RF output, however, the shunt circuit will be between the nodes, which may affect the characteristics of the circuit and the signal. In the second bypass mode, both switches are open and the shunt circuit is excluded. Further, the one or more capacitors that are included as C1 may be shorted so that the signal may pass from RF input to the RF output with minimal impact from the impedance matching circuit 2100. In some embodiments, the bypass modes may be optional.

Example Wireless Device with Impedance Matching Circuit

Figure 22:
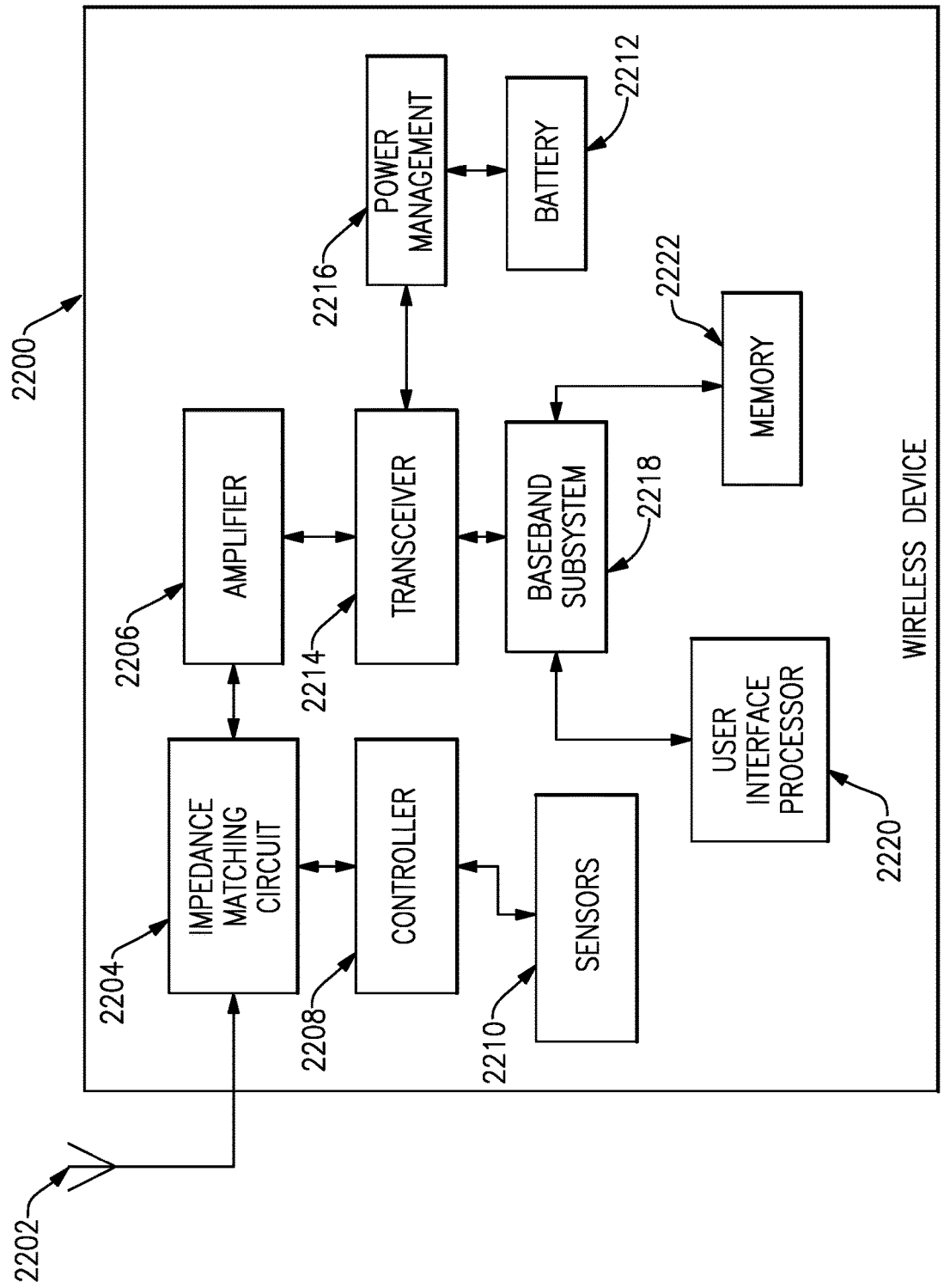
FIG. 22 illustrates an example of a wireless device that includes an impedance matching circuit.

FIG. 22 illustrates an example of a wireless device 2200 including an impedance matching circuit 2204. Although described as a wireless device, the device 2200 may include any type of device that may include elements with mismatched impedances in communication with each other.

The impedance matching circuit 2204 may include any type of L-network impedance matching circuit as previously described. For example, the impedance matching circuit 2204 may include the impedance matching circuits 1400, 1800, or 2100. Each ingress/egress node of the impedance matching circuit 2204 may be in communication with a different device or subsystem of the wireless device 2200. For example, as illustrated in FIG. 2200, the impedance matching circuit 2204 may be positioned between an antenna 2202 and an amplifier 2206, and in communication with the same, enabling the impedance matching circuit 2204 to match the impedance between the antenna 2202 and the amplifier 2206. The amplifier 2206 can include any type of amplifier that may be used with the device 2200. For example, the amplifier may be a power amplifier (PA) or a power amplifier module (PAM), a low noise amplifier (LNA), etc.

In addition to the antenna 2202 and the amplifier 2206, the impedance matching circuit 2204 may be in communication with a controller 2208. The controller 2208, in some implementations, may be configured to set or control the impedance matching circuit 2204. In some embodiments, the controller 2208 may use one or more sensors 2210 to facilitate determining settings for the impedance matching circuit 2204 or to set the configuration of the impedance matching circuit 2204. The one or more sensors 2210 can include any type of sensor that may detect a condition or setting of the wireless device 2200 that may affect the impedance of the wireless device subsystems of the wireless device 2200 placed in connection with either ingress/egress port of the impedance matching circuit 2204 (e.g., the antenna 2202 and/or the amplifier 2206 of the example illustrated in FIG. 22). For example, the sensors 2210 may include a temperature sensor for detecting the temperature of subsystems in the wireless device 2200, a temperature sensor for detecting the temperature external to the wireless device 2200 (e.g., ambient temperature), a sensor for detecting an orientation of the wireless device 2200, a sensor for detecting the proximity of objects to the wireless device 2200 or a portion thereof (e.g., a hand covering the antenna 2202, a wall within a threshold proximity of the wireless device 2200, a protective cover or case housing the wireless device 2200, etc.), a sensor for determining a mechanical state of the wireless device 2200 (e.g., a flip cover is open/closed, a slider cover is open/closed, etc.), a battery sensor for determining the quantity of charge remaining in the battery 2212, a charging sensor for determining whether the battery 2212 is being charged and/or if the wireless device 2200 is being powered by the battery or a wall outlet, and the like.

Alternatively, or in addition, to the sensors 2210, the controller 2208 may determine settings or the configuration for the impedance matching circuit 2204 based on the settings or configuration of one or more additional elements or subsystems of the wireless device 2200. For example, if the transceiver 2214 is configured to transmit a signal at a particular frequency or if the amplifier 2206 is configured to amplify the signal at a particular rate, the controller 2208 may determine an anticipated impedance mismatch between the amplifier 2206 and the antenna 2202 and may configure the impedance matching circuit 2204 accordingly.

Further, the controller 2208 may determine settings or the configuration for the impedance matching circuit 2204 based on data associated with one or more additional elements or subsystems of the wireless device 2200. This data may further include configuration rules that may be accessed from a repository (not shown) at the wireless device 2200 or otherwise. For instance, the controller 2208 may access a set of configuration rules from a repository that indicates the settings for the impedance matching circuit 2204 based on a detected proximity from a cellular tower, or for a particular operating frequency of the wireless device 2200 during transmission or receipt of a wireless signal.

In some embodiments, the control of the impedance matching circuit 2204 may be open-loop. In such embodiments, the controller 2208 may determine the conditions or operating environment, as described above, of the wireless device 2200 and may configure the impedance matching circuit 2204 accordingly. For example, the controller 2208 may determine the wireless device 2200 is being held against a user (e.g., held to the user's ear) and may determine the ambient temperature for the wireless device 2200, and based on these conditions, the controller 2208 may configure the impedance matching circuit 2204 accordingly.

Alternatively, the control of the impedance matching circuit 2204 may be closed-loop. In such embodiments, the controller 2208 may configure the impedance matching circuit 2204 as described with respect to open-loop control. In addition, the controller 2208 may continue to refine or update the settings of the impedance matching circuit 2204 using, for example, feedback relating to the impedance detected at either end of the impedance matching circuit 2204 (e.g., the antenna 2202 impedance and the amplifier 2206 impedance). Further, the controller 2208 may continue to refine or update settings of the impedance matching circuit 2204 based, at least partially, on conditions of the wireless device 2200 detected by, for example, the sensors 2210.

Controlling the impedance matching circuit 2204 can include determining the switches to open or close of the impedance matching circuit 2204 to move the shunt circuit (e.g., the shunt circuit 1402) so that the shunt circuit is electrically connected to the subsystem of one ingress/egress node (e.g., the node 1406) or the other ingress/egress node (e.g., the node 1408) of the impedance matching circuit 2204 (e.g., the antenna 2202 or the amplifier 2206 of the wireless device 2200). Further, in some cases, controlling the impedance matching circuit 2204 can include configuring the tunable capacitors. For example, controlling the impedance matching circuit 2204 may include opening or closing switches to vary the number of capacitors of the binary weighted digital switch capacitors (e.g., C1 and/or C2 of FIG. 18) are contributing to the capacitance value of the tunable capacitor elements.

In addition to the aforementioned subsystems and components, the wireless device 2200 may include a number of other types of devices and/subsystems. For example, as illustrated in FIG. 22, the wireless device may include a power management system 2216, a baseband subsystem 2218, a user interface processor 2220, a memory module 2222, etc. Further, although not illustrated, the wireless device may include a number of additional processors and devices, such as a central processing unit (CPU) a graphical processing unit (GPU), an analog-to-digital convertor, a digital-to-analog convertor, and the like. Moreover, one or more of the systems illustrated with respect to the wireless device 2200 may be optional. For example, the user interface processor 2220 may be optional. In some embodiments, one or more of the systems illustrated in FIG. 22 may be included as part of a front-end module. For example, one or more of the controller 2208, the impedance matching circuit 2204, the amplifier 2206, the transceiver 2214, and the baseband system 2218 may be included as part of a front-end module.

Other configurations of the wireless device 2200 are possible. For example, the wireless device 2200 may include a receiver that can include an antenna in electrical communication with a diplexer. The diplexer may be electrically connected to a band-pass filter, which may itself be electrically connected to a low noise amplifier (LNA). The impedance tuner or impedance matching circuit 2204 can be placed between the interfaces of one or more of the blocks of the receiver. For example, the impedance matching circuit 2204 may be electrically connected between the antenna and the diplexer or between the band-pass filter and the LNA. Generally, the impedance matching circuit 2204 is positioned in a location that is likely to require a wide tuning range.

In certain embodiments, the impedance matching circuit 2204 is used in a diversity-receiver path with a diversity antenna, which is generally limited to receiving signals. This is often the case because signal power is larger than the voltage handling capability of the switches used with the impedance tuner. However, it is possible to use the impedance matching circuit 2204 with a main antenna, which may be used for both receiving and transmitting. For example, if the impedance matching circuit 2204 includes high-voltage handling switches, the impedance matching circuit 2204 may be utilized with antennas that perform transmitting functions, such as a main antenna.

Additional Embodiments

In some embodiments, a method may be performed for matching the impedance of two or more device elements of a circuit or a wireless device. To simplify discussion, this method will be described with respect to matching the impedance of two device elements, such as an antenna and an amplifier, which may be included as part of a front-end module. The method may be performed by any system that can control or configure an impedance matching circuit 2204. For example, the method may be performed by the controller 2208, which may be separate from or part of the impedance matching circuit 2204.

In some implementations, the method may include determining by, for example, a controller 2208 a first impedance value for a first circuit element (e.g., the antenna 2202). Although the first circuit element can include different circuit elements (e.g., a sensor, a transceiver, etc.) to simplify discussion, the method will be described using the antenna 2202 as the first circuit element. Typically, although not necessarily, the first circuit element is in direct electrical communication with the impedance matching circuit. For example, if the antenna 2202 is in electrical communication with the impedance matching circuit 1400, the antenna 2202 may be connected to the node 1406 or 1408. In some embodiments, a circuit element, such as a resistor, may be electrically connected between the first circuit element (e.g., the antenna 2202) and the impedance matching circuit 2204.

The controller 2208 may determine a second impedance value for a second circuit element (e.g., the amplifier 2206). Although the second circuit element can include different circuit elements (e.g., a sensor, a transceiver, etc.) to simplify discussion, the method will be described using the amplifier 2206 as the second circuit element. Typically, although not necessarily, the second circuit element is in direct electrical communication with the impedance matching circuit. For example, if the amplifier 2206 is in electrical communication with the impedance matching circuit 1400, the amplifier 2206 may be connected to the node opposite from the node in electrical communication with the antenna 2202 (e.g., the node 1408 if the antenna is in electrical communication with the node 1406). In some embodiments, a circuit element, such as a resistor, may be electrically connected between the second circuit element (e.g., the amplifier 2206) and the impedance matching circuit 2204.

The controller 2208 may compare the first impedance value and the second impedance value to determine whether the impedances of the antenna 2202 and the amplifier 2206 are mismatched. If the impedances are not mismatched, the controller 2208 may configure the impedance matching circuit 2204 to enter a bypass mode by, for example, opening switches of the shunt element so as to electrically exclude the shunt element from the impedance matching circuit 2204.

If the controller 2208 determines that the impedances are mismatched, the controller 2208 can configure the impedance matching circuit 2204 to modify the impedance of one of the circuit elements to match the impedance of the other circuit element. For example, if the antenna 2202 has a higher impedance than the amplifier 2206, the controller 2208 may configure the impedance matching circuit 2204 such that the shunt element of the impedance matching circuit 2204 is in direct electrical communication with the node of the impedance matching circuit 2204 that is electrically connected to the antenna 2202. In some cases, one or more circuit elements may be electrically connected between the shunt element and the node that is in electrical communication with the antenna 2202. The controller 2208 may configure the impedance matching circuit 2204 by opening and closing switches of the impedance matching circuit 2204 as previously described (e.g., with respect to FIGS. 16A and 16B). In some embodiments, switches may also be opened or closed to modify the impedance created by the shunt element. For example, the digital switched capacitors of the impedance matching circuit 2204 may be configured by opening and closing particular switches of the DSCs.

In some embodiments, the impedance matching circuit 2204 may be configured and reconfigured as the impedance of first circuit element and the second circuit element change. For example, the impedance of the antenna 2202 may vary with respect to the position of a user's hand or head in relation to the antenna 2202. In such cases, the controller 2208 may dynamically shift the shunt of the impedance matching circuit 2204 from one node to the other node by modifying electrical connections through the opening and closing of switches included in the impedance matching circuit 2204. In some cases, the impedance of a circuit element or an anticipated change to the impedance of a circuit element may be determined based on information from the sensors 2210.

Further, in some cases, it is not always possible to match the impedance of the first and the second circuit element. For example, the impedance of the first circuit element may fluctuate over a range of values based on a constantly changing environment due, for example, to a user's interaction with the wireless device. In such cases, the controller 2208 may configure the impedance matching circuit 2204 to minimize the impedance mismatch between the first circuit element and the second circuit element within the capability of the particular impedance matching circuit 2204. For example, if the granularity of the impedance matching circuit 2204 supports modifying the impedance within $10\Omega$, the controller 2208 may match the impedance of the first and second circuit element within $10\Omega$.

GENERAL COMMENTS

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of matching impedance, the method comprising:
   determining a first impedance value of a first radio frequency element;
   determining a second impedance value of a second radio frequency element;
   configuring an impedance matching network positioned between the first radio frequency element and the second radio frequency element based on a measure of a difference between the first impedance value and the second impedance value, the impedance matching circuit including a shunt element and a series element, the shunt element including a tank circuit that includes a capacitor connected in parallel with an inductor, the shunt element configurable to be positioned between the first radio frequency element and the series element when the first impedance value is greater than the second impedance value, and the shunt element configurable to be positioned between the second radio frequency element and the series element when the second impedance value is greater than the first impedance value; and
   modifying the configuration of the impedance matching network based on a detected change in a measure of the difference between the first impedance value and the second impedance value.

2. The method of claim 1 further comprising configuring the impedance matching network to enter a bypass mode upon determining that the measure of the difference between the first impedance value and the second impedance value is below a threshold difference.

3. The method of claim 2 wherein configuring the impedance matching network to enter the bypass mode includes electrically disconnecting a shunt element of the impedance matching network from a signal path between the first radio frequency element and the second radio frequency element.

4. The method of claim 2 wherein configuring the impedance matching network to enter the bypass mode includes electrically connecting a shunt element of the impedance matching network to both the first radio frequency element and the second radio frequency element.

5. The method of claim 1 wherein the impedance matching network includes a plurality of switches.

6. The method of claim 5 wherein said configuring the impedance matching network includes modifying positions of the switches based on the difference between the first impedance value and the second impedance value.

7. The method of claim 1 wherein configuring the impedance matching network includes configuring the shunt element of the impedance matching network to be in direct communication with one of the first radio frequency element or the second radio frequency element and not in direct communication with the other of the first radio frequency element or the second radio frequency element.

8. The method of claim 1 wherein modifying the configuration of the impedance matching network includes configuring the shunt element of the impedance matching network to cease being in direct communication with one of the first radio frequency element or the second radio frequency element and begin being in direct communication with the other of the first radio frequency element or the second radio frequency element.

9. The method of claim 1 wherein the first radio frequency element is an antenna and the second radio frequency element is an amplifier.

10. The method of claim 1 further comprising repeating said modifying the configuration of the impedance matching network each time an additional detected change in the measure of the difference between the first impedance value and the second impedance value occurs.

11. The method of claim 1 wherein the tank circuit includes a binary weighted digital switch capacitor.

12. The method of claim 1 further comprising configuring a series element of the impedance matching network based on the measure of the difference between the first impedance value and the second impedance value.

13. A method of matching impedance, the method comprising:
   determining a first impedance value for a first circuit element in electrical communication with an impedance matching circuit;
   determining a second impedance value for a second circuit element in electrical communication with the impedance matching circuit, the impedance matching circuit including a shunt element that is configurable to electrically communicate directly with the first circuit element or the second circuit element, the shunt element including a tank circuit that includes a capacitor connected in parallel with an inductor;
   comparing the first impedance value to the second impedance value to determine whether the first impedance value is greater than the second impedance value;
   responsive to determining that the first impedance value is greater than the second impedance value at a first time, configuring the shunt element of the impedance matching circuit to be in direct electrical communication with the first circuit element and not the second circuit element; and
   responsive to determining that the first impedance value is less than the second impedance value at a second time, configuring the shunt element of the impedance matching circuit to be in direct electrical communication with the second circuit element and not the first circuit element.

14. The method of claim 13 wherein the impedance matching circuit includes a series element and the method further includes configuring the shunt element of the impedance matching circuit to be in direct electrical communication with a first port of the series element at the first time and configuring the shunt element of the impedance matching circuit to be in direct electrical communication with a second port of the series element at the second time.

15. The method of claim 14 wherein the series element includes a capacitor and an inductor connected in series, the shunt element in direct electrical connection with one of the capacitor or the inductor at the first time, and in direct electrical connection with the other of the capacitor or the inductor at the second time.

16. The method of claim 14 further comprising disconnecting the shunt element from the series element at a third time.

17. The method of claim 13 wherein responsive to determining that the first impedance value matches the second impedance value to a threshold degree, the method further comprises configuring the impedance matching circuit to be in a bypass mode.

18. The method of claim 13 wherein configuring the shunt element of the impedance matching circuit to be in direct electrical communication with the first circuit element and not the second circuit element includes closing a first switch between the shunt element and the first circuit element and opening a second switch between the shunt element and the second circuit element.

19. The method of claim 13 wherein configuring the shunt element of the impedance matching circuit to be in direct electrical communication with the first circuit element and not the second circuit element includes modifying the positioning of a single pole three throw switch.

20. The method of claim 13 wherein the capacitor is a binary weighted digital switch capacitor.

* * * * *